(12) United States Patent
Kuroda et al.

(10) Patent No.: US 7,777,437 B2
(45) Date of Patent: Aug. 17, 2010

(54) SWITCHING CONTROL SYSTEM AND MOTOR DRIVING SYSTEM

(75) Inventors: Keisuke Kuroda, Osaka (JP); Ken Maruyama, Osaka (JP)

(73) Assignee: Panasonic Corporation, Osaka (JP)

( * ) Notice: Subject to any disclaimer, the term of this patent is extended or adjusted under 35 U.S.C. 154(b) by 251 days.

(21) Appl. No.: 11/898,443

(22) Filed: Sep. 12, 2007

(65) Prior Publication Data

US 2009/0066375 A1    Mar. 12, 2009

(30) Foreign Application Priority Data

Sep. 7, 2007    (JP)    ............ 2007-232118

(51) Int. Cl.
    *H02P 6/14* (2006.01)
(52) U.S. Cl. ............ 318/400.26; 318/400.29
(58) Field of Classification Search ............ 318/400.26, 318/400.27, 400.29, 432, 801
    See application file for complete search history.

(56) References Cited

U.S. PATENT DOCUMENTS 6,005,366 A * 12/1999 Majumdar et al. .......... 318/811
6,172,474 B1 * 1/2001 Gotou .................... 318/400.01
6,903,526 B2 * 6/2005 Weisser et al. .......... 318/400.29
6,977,535 B2 * 12/2005 Otani et al. ................. 327/112

FOREIGN PATENT DOCUMENTS

JP    2004-215493    7/2004
JP    2005-086380    3/2005

* cited by examiner

*Primary Examiner*—Rina I Duda
(74) *Attorney, Agent, or Firm*—Steptoe & Johnson LLP

(57) ABSTRACT

The present invention inexpensively controls a turn-on and turn-off switching speed for MOS transistors made in accordance with various specifications. According to the present invention, during an output voltage rise period for a turn-on operation of the MOS transistor, a fixed current determined by a first clip circuit and a resistor is input to a gate terminal of the MOS transistor to obtain a linear rise slew rate. During an output voltage drop period for a turn-off operation of the MOS transistor, a fixed current determined by a second clip circuit 38 and a resistor is input to the gate terminal of the MOS transistor to obtain a linear drop slew rate.

10 Claims, 18 Drawing Sheets

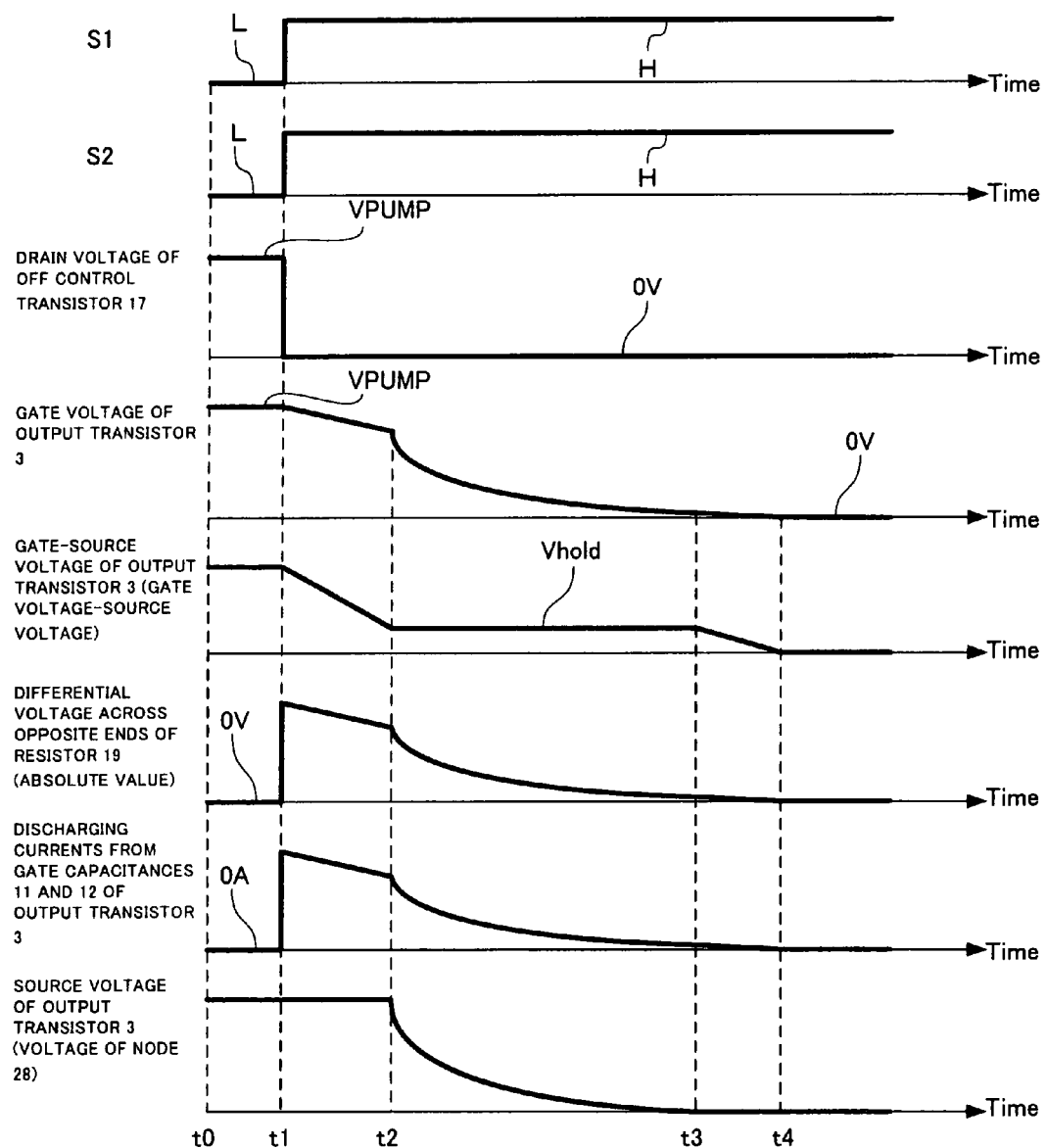

SWITCHING CONTROL SYSTEM AND MOTOR DRIVING SYSTEM

The present application claims priority to Japanese Patent Applications No. 2007-232118, filed Sep. 7, 2007, the entire contents of which are expressly incorporated by reference.

FIELD OF THE INVENTION

The present invention relates to a motor driving system, and in particular, to a switching control system that performs PWM (Pulse Width Modulation).

BACKGROUND OF THE INVENTION

PWM driving is a method of turning on or off output transistors connected to an inductive load for a motor and varying the ratio of turned-on transistors to turned-off transistors to control the amount of power supplied to the inductive load. The PWM driving is well known as a power-saving driving method. MOSFETs are commonly used as the output transistors connected to the inductive load for the motor. A predrive circuit is required to drive control terminals for the output transistors.

With the output transistors, too high a switching speed for the turn-on or turn-off operation may rapidly vary voltage to cause elements to malfunction or be destroyed. Furthermore, such a switching speed may pose a problem such as possible destruction or the possible disturbance of other electronic apparatuses due to noise. In contrast, too low a switching speed may pose a problem such as operational errors resulting from possible delay or the increased amount of generated heat resulting from increased losses.

To solve the problems, attempts have been made to control a speed at which a voltage is applied to each control terminal or removed from the control terminal, to set the slew rate of a variation in the output voltage from the output transistor at a well-balanced value at the time of turning on or off the output transistor.

As a first example of a conventional technique, an example of a well-known common predrive circuit is shown in FIG. 17. In FIG. 17, reference numerals 1 and 2 denote predrive circuits that control switching of output transistors 3 to 6. The output transistors 3 to 6 are assumed to be N-type MOS transistors. An anode and a cathode of a diode 7 are connected to a source and a drain, respectively, of the output transistor 3. Similarly, diodes 8 to 10 are connected to the output transistors 4 to 6, respectively. Reference numeral 11 denotes a gate-drain parasitic capacitance in the output transistor 3. Reference numeral 12 denotes a gate-source parasitic capacitance in the output transistor 3. The parasitic capacitance is also present in the output transistors 4, 5, and 6 (not shown). Internal circuits in the predrive circuits 1 and 2 are identical. Thus, the internal circuit in the predrive circuit 1 will be described below.

The output transistors 3 and 4 are a high-side output transistor and a low-side output transistor, respectively. The drain of the output transistor 3 and a source of the output transistor 4 are connected together in series between a power supply terminal 13 to which a power supply voltage VCC (first power supply) is applied, and a ground (second power supply). Furthermore, an on control transistor 16, a resistor 18, a resistor 19, and an off control transistor 17 are connected together in series between a booster terminal 14 to which a VPUMP voltage set equal to or higher than the power supply voltage VCC is applied, and the ground. A gate terminal of the output transistor 3 is connected to a connection point between the resistor 18 and the resistor 19. Reference numeral 20 denotes an on and off control circuit for the output transistor 4. A diode 21 prevents a reverse voltage of the gate-source voltage of the output transistor 3 from exceeding a breakdown voltage.

Application of an input signal S1 to an input terminal 22 operates the on control transistor 16. Application of an input signal S2 to an input terminal 23 operates the off control transistor 17. Application of an input signal S3 to an input terminal 24 operates the output transistor 4. The predrive circuit 2 has input terminals 25, 26, and 27 corresponding to the input terminals 22, 23, and 24 of the predrive circuit 1. Input signals S4, S5, and S6 are applied, respectively.

Reference numeral 15 denotes an inductive load. One end of the inductive load is connected to a connection point between the output transistor 3 and the output transistor 4. The other end of the inductive load is connected to a connection point between the output transistor 5 and the output transistor 6.

With reference to a time chart in FIG. 18, a turn-on switching operation of the output transistor 3 will be described. In the time chart in FIG. 18, it is assumed that a driving current is flowing through the inductive load 15 in an a direction and that the output transistor 4 is off.

At an initial t0, input signals S1 and S2 are at a high level. Thus, the gate voltage of the output transistor 3 is at a low level, and the output transistor 3 is off. The current flowing through the inductive load 15 in the a direction flows from the ground through a diode 8. Thus, the voltage of a source terminal (node 28) that is an output terminal of the output transistor 3 is at the low level.

At t1, S1 and S2 are switched to the low level, the on control transistor 16 is turned on, and the off control transistor 17 is turned off. This starts charging gate capacitances 11 and 12 of the output transistor 3. The gate-source voltage (gate voltage-source voltage) of the output transistor 3 starts to increase.

At t2, the gate-source voltage of the output transistor 3 increases enough to allow the output transistor 3 to supply all the current flowing through the inductive load 15. The voltage of the node 28 then starts to rise. The gate-source voltage of the output transistor 3 at this point in time is defined as Vhold. While the voltage of the node 28 is rising, the gate-source voltage of the output transistor 3 is smoothed to the given voltage Vhold. Smoothing of the gate-source voltage is a general property of MOS transistors.

After rising completely to the high level at t3, the voltage of the node 28 keeps the high level. After t3, the gate-source voltage of the output transistor 3 starts to increase again. At t4, the gate voltage of the output transistor 3 rises completely to the high level. The gate-source voltage of the output transistor 3 then stops increasing.

During a period from t2 to t3, when the voltage of the node 28 rises, the gate-source voltage of the output transistor 3 is smoothed to the given voltage Vhold. This prevents the gate-source capacitance 12 from being charged. That is, during this period, the gate voltage of the output transistor 3 rises in accordance with time constants for the resistor 18 and the gate-drain capacitance 11. That is, the slew rate of the voltage of the node 28 is controlled by the time constants for the resistor 18 and the gate-drain capacitance 11.

Now, with reference to a time chart in FIG. 19, a turn-off switching operation of the output transistor 3 will be described. In the time chart in FIG. 19, it is assumed that the driving current is flowing through the inductive load 15 in the a direction and that the output transistor 4 is off.

At the initial t0, the input signals S1 and S2 are at the low level. Thus, the gate voltage of the output transistor 3 is at the high level, and the output transistor 3 is on. The voltage of the node 28 is at the high level.

At t1, S1 and S2 are switched to the high level, the on control transistor 16 is turned off, and the off control transistor 17 is turned on. This causes the gate capacitances 11 and 12 of the output transistor 3 to discharge. The gate-source voltage of the output transistor 3 starts to decrease.

At t2, the gate-source voltage of the output transistor 3 decreases to the Vhold voltage to start dropping the voltage of the node 28. While the voltage of the node 28 is dropping, the gate-source voltage of the output transistor 3 is smoothed to the given voltage Vhold. As described above, smoothing of the gate-source voltage is a general property of MOS transistors.

After dropping completely to the low level at t3, the voltage of the node 28 keeps the low level. After t3, the gate-source voltage of the output transistor 3 starts to decrease again. At t4, the gate voltage of the output transistor 3 drops completely to the low level. The gate-source voltage of the output transistor 3 then stops decreasing.

During the period from t2 to t3, when the voltage of the node 28 drops, the gate-source voltage of the output transistor 3 is smoothed to the given voltage Vhold. This prevents the gate-source capacitance 12 from discharging. That is, during this period, the gate voltage of the output transistor 3 drops in accordance with time constants for the resistor 19 and the gate-drain capacitance 11. That is, the slew rate of the voltage of the node 28 is controlled by the time constants for the resistor 19 and the gate-drain capacitance 11.

As a second example of the conventional technique, JP2005-86380A describes a method of controlling the slew rate. In the second example, the predrive circuit has a plurality of series circuits connected together in parallel and each including an on control transistor and a resistor and a plurality of series circuits connected together in parallel and each including an off control transistor and a resistor, all the series circuits being connected to the gate terminal of the output transistor. In the configuration of the second example, an inductive load end voltage is sampled in chronological order during the switching operation of the output transistor. A microprocessor is then used to calculate the amount of a variation in voltage. The data obtained is subjected to feedback control to allow the selection of a control transistor to be turned on. The slew rate control is performed by selecting the on control transistor for a turn-on operation, while selecting the off control transistor for a turn-off operation.

As a third example of the conventional technique, JP2004-215493A describes a method of controlling the slew rate. A current source for turn-on control and a current source for turn-off control are connected to the gate terminal of the output transistor. The current values of the current sources can be varied on the basis of information from a current source setting terminal. In the configuration of the third example, the slew rate control is performed by charging the gate terminal with a fixed current for a turn-on operation of the output transistor and causing the gate terminal to discharge a fixed current for a turn-off operation of the output transistor. The variable current value of the current source enables the slew rate to be set. Moreover, the configuration can be generally used for output transistors of various sizes.

The known common configurations disadvantageously have difficulty setting the slew rate of an output voltage from the high-side output transistor (node 28). This is because the slew rate is controlled in accordance with the time constants as described above and is thus high immediately after a rise or drop in output voltage and then decreases gradually. Specifically, in FIGS. 18 and 19, since the slew rate is high immediately after t2, disadvantageously the voltage may vary rapidly to cause malfunctioning or destruction of elements and noise may be generated to disturb other electronic apparatuses. Immediately before t3, the low slew rate may pose a problem such as operational errors resulting from possible delay or the increased amount of generated heat resulting from increased losses, during switching. This means that it is difficult to set the slew rate at a well-balanced value.

Furthermore, the configuration in JP2005-86380A requires the plurality of series circuits each including the on control transistor and the resistor, the plurality of series circuits each including the off control transistor and the resistor, a sampling circuit for the output voltage, the microprocessor calculating a sampling voltage, and the like. This complicates controllability and increases the scale of the circuit. Moreover, the configuration can be generally used for output transistors of various sizes. This means the need for a large number of series circuits each including the on control transistor and the resistor and a large number of series circuits each including the off control transistor and the resistor.

The configuration in JP2004-215493A requires current source setting information. This means that the number of external input terminals increases when the switching control system is composed of a semiconductor integrated circuit. This in turn prevents the use of more inexpensive small-sized packages.

The configurations in JP2005-86380A and JP2004-215493A have the increased circuit scales and the increased numbers of external input terminals. This may inhibit a reduction in the price and size of the switching control system.

The present invention solves the above problems. An object of the present invention is to obtain a desired slew rate and to reduce the price and size of the switching control system. Another object of the present invention is to provide a switching control system that can be generally used for output transistors of various sizes.

DISCLOSURE OF THE INVENTION

To accomplish the objects, a first aspect of the present invention provides a switching control system including:

a first MOS transistor and a second MOS transistor connected in series between a first power source and a second power source in order to sequentially pass a current through one of a single-phase inductive load and a plural-phase inductive load;

an on control circuit that turns on the first MOS transistor;

a resistor connected between an output terminal of the on control circuit and a gate terminal of the first MOS transistor; and a first clip circuit that clips a voltage of the output terminal of the on control circuit with respect to a voltage of a source terminal of the first MOS transistor, wherein for a turn-on operation of the first MOS transistor, a current input to the gate terminal of the first MOS transistor is determined by:

a first clip voltage determined by the first clip circuit;

a voltage between the gate terminal and source terminal of the first MOS transistor; and the resistor connected between the output terminal of the on control circuit and the gate terminal of the first MOS transistor.

According to a second aspect of the present invention, in the first aspect, the on control circuit includes:

an on control transistor; and a resistor connected to a control terminal of the on control transistor, and the first clip circuit includes:

a first differential voltage sensing circuit that senses a differential voltage between the voltage of the source terminal of the first MOS transistor and the voltage of the output terminal of the on control circuit; and a first feedback circuit that feeds back a signal output by the first differential voltage sensing circuit to the control terminal of the on control transistor.

According to a third aspect of the present invention, in the second aspect, the first differential voltage sensing circuit includes:

a first clip voltage setting circuit having an input terminal connected to the source terminal of the first MOS transistor and including one of at least one diode, at least one Zener diode, and at least one resistor; and a first voltage/current converting circuit which converts a differential voltage between the voltage of the output terminal of the on control circuit and the voltage of the output terminal of the first clip voltage setting circuit into a current and which then outputs the current, wherein an output current from the first voltage/current converting circuit is input to the first feedback circuit as an output signal from the first differential voltage sensing circuit.

According to a fourth aspect of the present invention, in a third aspect, the first feedback circuit is a current mirror circuit that inputs a current of a value corresponding to a current value output by the first differential voltage sensing circuit, to the control terminal of the on control transistor.

A fifth aspect of the present invention provides a switching control system including:

a first MOS transistor and a second MOS transistor connected in series between a first power source and a second power source in order to sequentially pass a current through one of a single-phase inductive load and a plural-phase inductive load;

an off control circuit that turns off the first MOS transistor;

a resistor connected between an output terminal of the off control circuit and a gate terminal of the first MOS transistor; and a second clip circuit that clips a voltage of the output terminal of the off control circuit with respect to a voltage of a source terminal of the first MOS transistor, wherein for a turn-off operation of the first MOS transistor, a current input to the gate terminal of the first MOS transistor is determined by:

a second clip voltage determined by the second clip circuit;

a voltage between the gate terminal and source terminal of the first MOS transistor; and the resistor connected between the output terminal of the off control circuit and the gate terminal of the first MOS transistor.

According to a sixth aspect of the present invention, in the fifth aspect, the off control circuit includes:

an off control transistor; and a resistor connected to a control terminal of the off control transistor, and the second clip circuit includes:

a second differential voltage sensing circuit that senses a differential voltage between the voltage of the source terminal of the first MOS transistor and the voltage of the output terminal of the off control circuit; and a second feedback circuit that feeds back a signal output by the second differential voltage sensing circuit to the control terminal of the off control transistor.

According to a seventh aspect of the present invention, in the sixth aspect, the second differential voltage sensing circuit includes:

a second clip voltage setting circuit having an input terminal connected to the source terminal of the first MOS transistor and including one of at least one diode, at least one Zener diode, and at least one resistor; and a second voltage/current converting circuit which converts a differential voltage between the voltage of the output terminal of the off control circuit and the voltage of the output terminal of the second clip voltage setting circuit into a current and which then outputs the current, wherein an output current from the second voltage/current converting circuit is input to the second feedback circuit as an output signal from the second differential voltage sensing circuit.

According to an eighth aspect of the present invention, in the seventh aspect, the second feedback circuit is a current mirror circuit that inputs a current of a value corresponding to a current value output by the second differential voltage sensing circuit, to the control terminal of the off control transistor.

A ninth aspect of the present invention provides a motor driving system including:

a motor including one of a single-phase inductive load and a plural-phase inductive load;

a first MOS transistor and a second MOS transistor connected in series between a first power source and a second power source, one end of the inductive load being connected to a series connection point between the first MOS transistor and the second MOS transistor; and a switching control system that performs switching control on the first MOS transistor and the second MOS transistor, wherein a plurality of the first MOS transistors and a plurality of the second MOS transistors are provided in accordance with the number of the phases of the inductive load, a plurality of the switching control systems are provided in accordance with each of a group of a plurality of the first MOS transistors and a group of a plurality of the second MOS transistors, and the switching control system has the configuration of the switching control system according to any of the first to eighth aspects of the present invention.

According to the present invention, in the turn-on operation of the high-side output transistor, while the output voltage of the high-side output transistor is rising, the clip control allows the control terminal of the output transistor to be charged with a current of a given value. The present invention can thus provide a very linear slew rate for the output voltage. In the turn-off operation of the high-side output transistor, while the output voltage of the high-side output transistor is dropping, the clip control allows the control terminal of the output transistor to discharge a current of a given value. The present invention can thus provide a very linear slew rate for the output voltage.

A clip circuit does not require any complicated control but requires only a small circuit scale. The values of the charging current and discharging current can be easily set using a clip voltage and resistance. This eliminates the need for an external input terminal for current setting.

This means that the present invention can prevent an increase in circuit scale and in the number of terminals, reduce the price and size of the system, and be applied to output transistors made in accordance with various specifications.

BRIEF DESCRIPTION OF THE DRAWINGS

FIG. 19 is a time chart for a well-known switching operation (turn-off).

DESCRIPTION OF THE EMBODIMENTS

With reference to the drawings, a specific description will be given of a switching control system showing an embodiment of the present invention.

Embodiment 1

Figure 1:
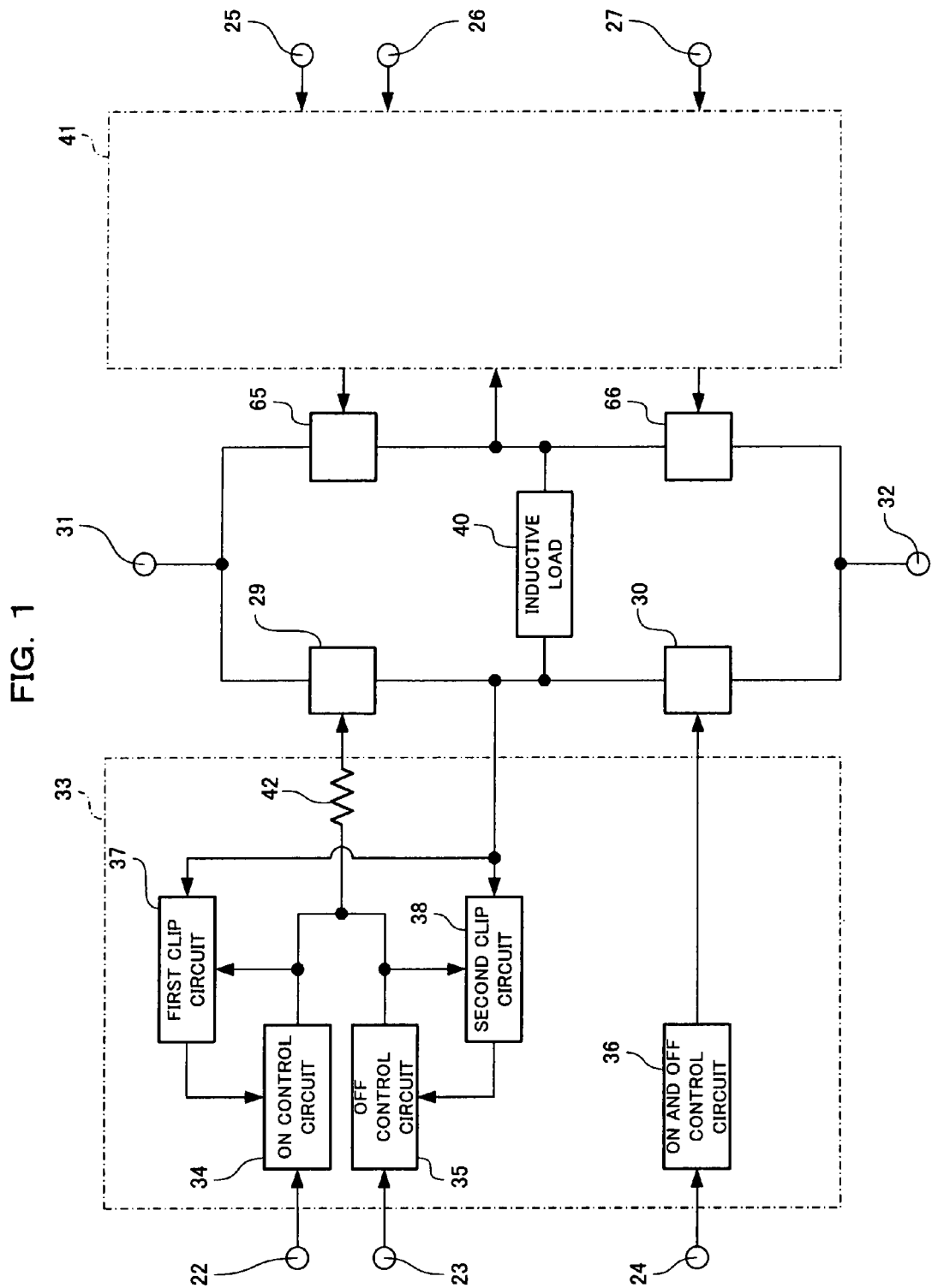
FIG. 1 is a block diagram of a switching control system according to Embodiment 1 of the present invention.

FIG. 1 shows a block diagram of Embodiment 1 of the present invention. Reference numerals 29 and 30 denote a first output transistor and a second output transistor. The output transistors 29 and 30 and output transistors 65 and 66 constitute an output circuit. Reference numerals 31 and 32 denote a first power supply terminal and a second power supply terminal, respectively, which are connected to the output circuit. Reference numeral 33 denotes a predrive circuit that drives the output transistors 29 and 30. Reference numeral 41 denotes a predrive circuit that drives the output transistors 65 and 66. Reference numeral 40 denotes an inductive load driven by the output circuit. The output transistors 29 and 30 are N-type MOS transistors. A drain terminal of the first output transistor 29 is connected to the first power supply terminal 31. A source terminal of the first output transistor 29 is connected to a drain terminal of the second output transistor 30. A source terminal of the output transistor 30 is connected to a second power supply terminal 32.

The predrive circuit 33 is composed of an on control circuit 34 that turns on the first output transistor 29, an off control circuit 35 that turns off the first output transistor 29, an on and off control circuit 36 that turns on and off the second output transistor 30, a first clip circuit 37 that clips the voltage of an output terminal of the on control circuit at any voltage value with respect to the voltage of the source terminal of the first output transistor 29, a second clip circuit 38 that clips the voltage of an output terminal of the off control circuit at any voltage value with respect to the voltage of the source terminal of the first output transistor 29, and a resistor 42 that sets a turn-on and turn-off switching speed for the first output transistor 29. Thus, Embodiment 1 is a configuration having the output transistors and the predrive circuit at each end of the inductive load to be driven.

The predrive circuit 41 has the same configuration as the predrive circuit 33 and controls the output transistors 65 and 66.

Figure 2:
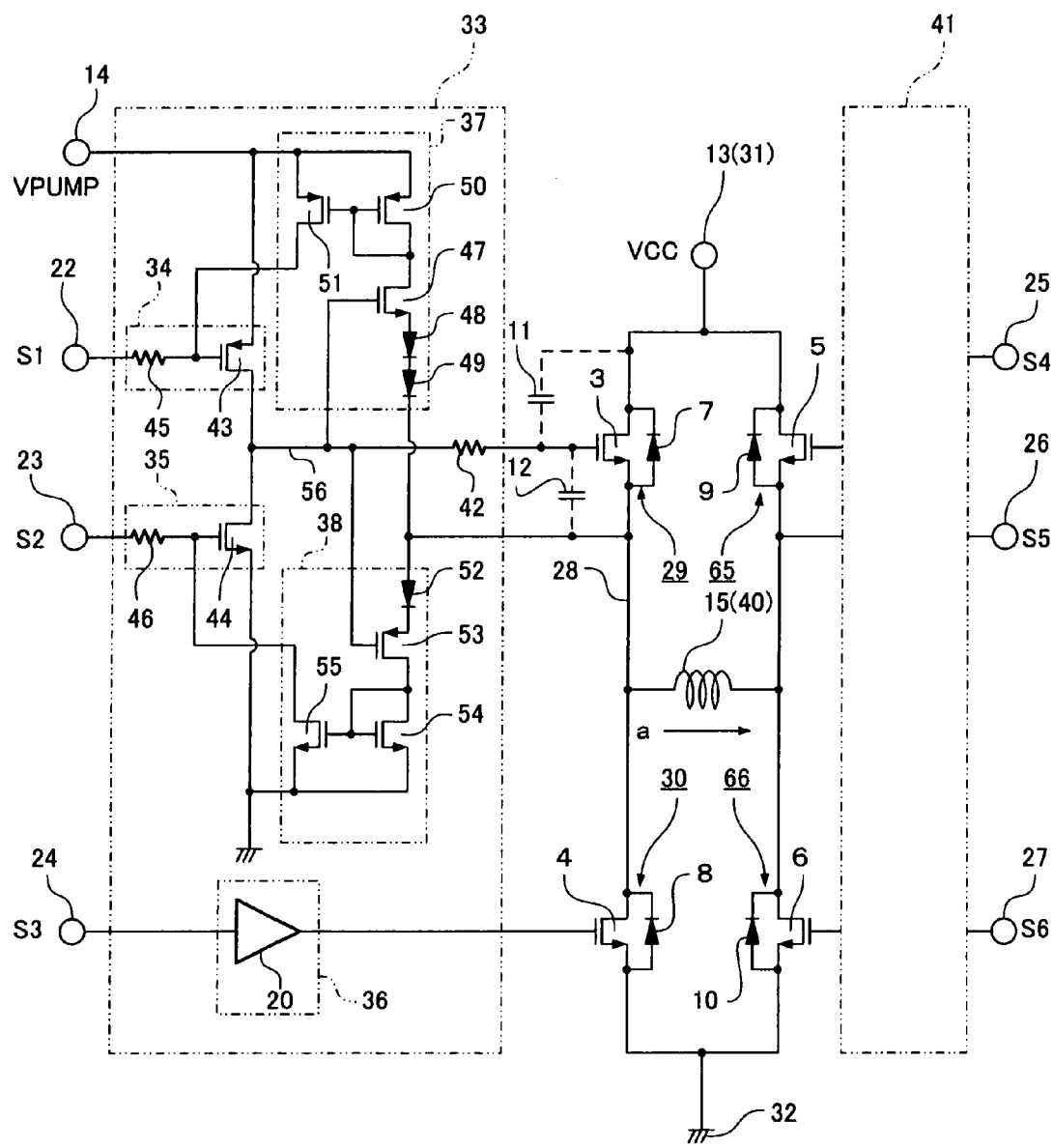
FIG. 2 is a specific circuit diagram of the switching control system according to Embodiment 1 of the present invention.

FIG. 2 shows a specific example of the circuit configuration.

Figure 17:
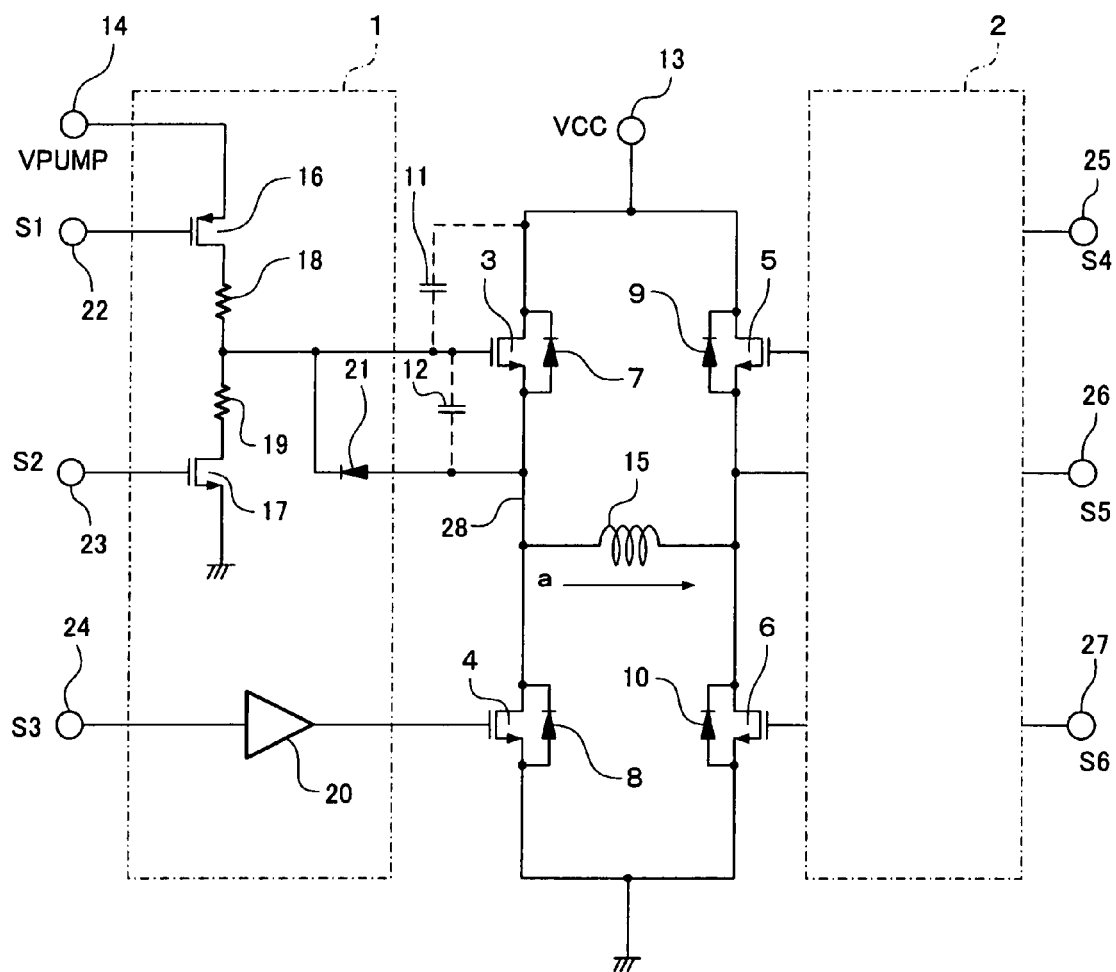
FIG. 17 is a diagram of an embodiment of a well-known common predrive circuit.

In FIG. 2, the components 3 to 15, 20, and 22 to 38 are configured in the same manner as that in the conventional example in FIG. 17. Thus, the components are denoted by the same reference numerals and will not be described. Furthermore, the predrive circuits 33 and 41 have the same circuit configuration. Only the predrive circuit 33 will thus be described.

The on control circuit 34 is composed of an on control transistor 43 and a resistor 45. One end of the resistor 45 is connected to a gate of the on control transistor 43. The other end of the resistor 45 is connected to the input terminal 22. The off control circuit 35 is composed of an off control transistor 44 and a resistor 46. One end of the resistor 46 is connected to a gate of the off control transistor 44. The other end of the resistor 46 is connected to the input terminal 23. The on control transistor 43 and the off control transistor 44 are connected in series between the booster terminal 14 and the ground. A connection point (node 56) between a drain terminal, that is, an output terminal of the on control transistor 43 and a drain terminal, that is, an output terminal of the off control transistor 44 is connected to the gate terminal of the output transistor 3 via the resistor 42 for setting the slew rate.

The first clip circuit 37 is composed of a voltage/current converting transistor 47 (voltage/current converting circuit), clip voltage setting diodes 48 and 49, and current mirror transistors 50 and 51. The voltage/current converting transistor 47 has a gate connected to the node 56, a source connected to an anode of the diode 48, and a drain connected to the primary current mirror transistor 50. The secondary current mirror transistor 51 is connected to the gate terminal of the on control transistor 43. The first clip circuit 37 configured as described above uses a differential voltage sensing circuit (the voltage/current converting transistor 47 and the clip voltage setting diodes 48 and 49) to sense the differential voltage between the voltage of the source terminal of the output transistor 3 and the voltage of the drain terminal of the on control transistor 43. An output signal from the differential voltage sensing circuit is fed back to the gate terminal of the on control transistor 43 by a feedback circuit (current mirror transistors 50 and 51). Specifically, the clip voltage setting diodes 48 and 49 set a first clip voltage. In accordance with the set first clip voltage, the voltage/current converting transistor 47 converts the differential voltage between the voltage of the source terminal of the output transistor 3 and the voltage of the drain terminal of the on control transistor 43 into a current and outputs the current. The output current resulting from the conversion is input to the primary current mirror transistor 50. The secondary current mirror transistor 51 outputs a current corresponding to a mirror ratio. The current output by the secondary current mirror transistor 51 is fed back to the gate terminal of the on control transistor 43.

The second clip circuit 38 is composed of a voltage/current converting transistor 53, a clip voltage setting diode 52, and current mirror transistors 54 and 55. The voltage/current converting transistor 53 has a gate connected to the node 56, a source connected to a cathode of the diode 52, and a drain connected to the primary current mirror transistor 54. The secondary current mirror transistor 55 is connected to the gate terminal of the off control transistor 44. The second clip circuit 38 configured as described above uses a differential voltage sensing circuit (voltage/current converting transistor 53 and clip voltage setting diode 52) to sense the differential voltage between the voltage of the source terminal of the output transistor 3 and the voltage of the drain terminal of the off control transistor 44. An output signal from the differential voltage sensing circuit is fed back to the gate terminal of the off control transistor 44 by a feedback circuit (current mirror transistors 54 and 55). Specifically, the clip voltage setting diode 52 sets a second clip voltage. In accordance with the set second clip voltage, the voltage/current converting transistor 53 converts the differential voltage between the voltage of the source terminal of the output transistor 3 and the voltage of the drain terminal of the off control transistor 44 into a current and outputs the current. The output current resulting from the conversion is input to the primary current mirror transistor 54. The secondary current mirror transistor 55 outputs a current corresponding to a mirror ratio for the primary current mirror transistor 54. The current output by the secondary current mirror transistor 55 is fed back to the gate terminal of the off control transistor 44.

The clip voltage setting diodes 48 and 49 are a first clip voltage setting circuit in the first clip circuit 37. The diode 52 is a second clip voltage setting circuit in the second clip circuit 38. The diodes may be omitted depending on a desired clip voltage value. The first clip voltage and the second clip voltage can be freely varied by using any combinatory circuit including a Zener diode or a resistor or a diode, a Zener diode, and a resistor.

Figure 5:
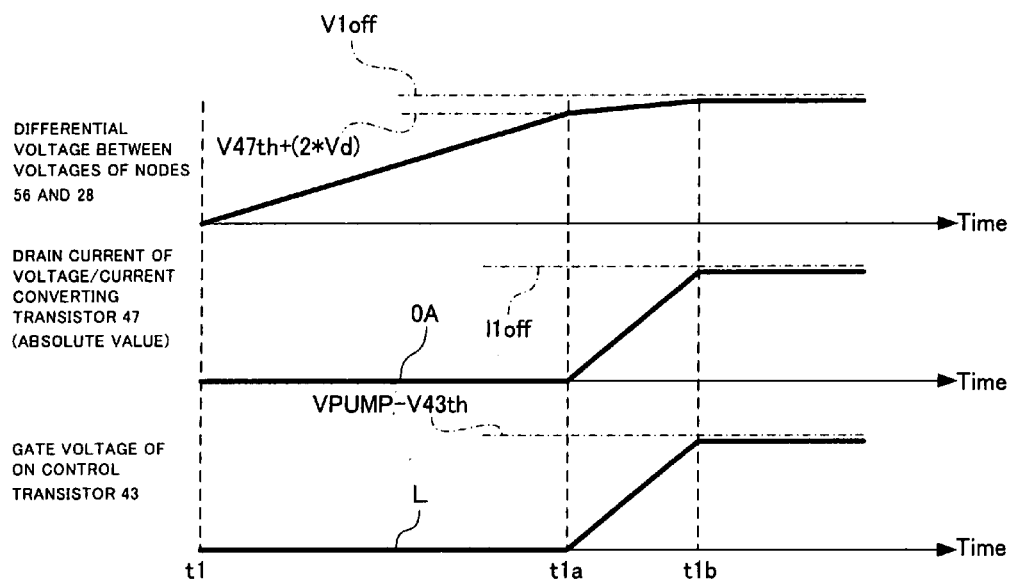
FIG. 5 is a time chart for a first clip circuit operation according to Embodiment 1 of the present invention.

First, with reference to a time chart in FIG. 5, the operation of the first clip circuit 37 will be described. FIG. 5 shows the operation of the first clip circuit 37 after t1 on the assumption that at the initial t1, S1 and S2 are switched from the high level to the low level. It is also assumed that the output impedance of S1 is sufficiently low with respect to the resistance value of the resistor 45 and is thus negligible. It is further assumed that a current flows through the inductive load 15 in the a direction.

At the initial t1, the on control transistor 43 is turned on to raise the voltage of the node 56 to shift the differential voltage (the voltage of the node 56—the voltage of the node 28) between the voltages of the nodes 56 and 28 in an increase direction. A gate-source threshold voltage (absolute value) for the voltage/current converting transistor 47 is defined as V47$th$. A forward breakdown voltage for the clip voltage setting diodes 48 and 49 is defined as Vd. Then, when the differential voltage between the voltages of the nodes 56 and 28 is {V47$th$+(2*Vd)} or less, the voltage/current converting transistor 47 is off. In this state, no current flows through the current mirror transistors 50 and 51. The gate voltage of the on control transistor 43 is thus the same as the voltage of S1 and is at the low level. In this state, the on control transistor 43 offers the lowest on resistance.

At t1$a$, the differential voltage between the voltages of the nodes 56 and 28 increases up to {V47$th$+(2*Vd)} to turn on the voltage/current converting transistor 47, which starts feeding a current. The current is fed by the primary current mirror transistor 50, and a discharge current is output to the secondary current mirror transistor 51. The current output by the secondary current mirror transistor 51 flows through the resistor 45 to S1, raising the gate voltage of the on control transistor 43. An increase in the differential voltage between the voltages of the nodes 56 and 28 increases the current flowing through the voltage/current converting transistor 47. Thus, the gate voltage of the on control transistor 43 increases. This indicates an increase in the on resistance of the on control transistor 43. The rise in the voltage of the node 56 slows after t1$a$.

The differential voltage between the voltages of the nodes 56 and 28 obtained when the gate voltage of the on control transistor 43 rises up to a threshold thereof (VPUMP−V43$th$) is defined as V1off. At t1$b$, the differential voltage between the voltages of the nodes 56 and 28 rises close to V1off and then almost stops rising. The operation after t1$b$ corresponds to the clip control.

The operation after t1$b$ is such that while the gate capacitances 11 and 12 of the output transistor 3 are being charged, the differential voltage between the voltages of the nodes 56 and 28 does not completely rise to V1off and exhibits a value slightly smaller than V1off. After the gate capacitances 11 and 12 of the output transistor 3 are completely charged, the differential voltage between the voltages of the nodes 56 and 28 completely reaches V1off. A specific operation after t1$b$ is shown below.

While the gate capacitances 11 and 12 of the output transistor 3 are being charged with a current, the charging current flows from the node 56 through the resistor 42. The voltage of the node 56 is thus higher than the gate voltage of the output transistor 3. In this state, if the differential voltage between the voltages of the nodes 56 and 28 rises up to V1off, the on control transistor 43 is completely turned off, interrupting the means for supplying a current to the node 56. This interrupts the charging current flowing from the node 56 through the resistor 42. The interruption of the current flowing through the resistor 42 changes the voltage of the node 56 so that the voltage drops toward the gate voltage of the output transistor 3. The drop in the voltage of the node 56 drops the differential voltage between the voltages of the nodes 56 and 28. The differential voltage between the voltages of the nodes 56 and 28 exhibits a value smaller than V1off. This turns on the on control transistor 43 again.

When the on control transistor 43 is turned on again, a current is supplied to the node 56 and the charging current flows from the node 56 through the resistor 42. The voltage of the node 56 thus changes so as to rise again.

The above control is such that after t1$b$, if the differential voltage between the voltages of the nodes 56 and 28 rises toward V1off, the differential voltage is dropped. This negative feedback control raises the differential voltage between the voltages of the nodes 56 and 28 if the differential voltage has dropped. In this case, the differential voltage between the voltages of the nodes 56 and 28 is balanced at a value slightly smaller than V1off by appropriately setting gain and phase so as to prevent the system of a feedback loop from oscillating.

After the gate capacitances 11 and 12 of the output transistor 3 are completely charged, that is, when the voltage of the node 56 becomes completely equal to the gate voltage of the output transistor 3, the differential voltage between the voltages of the nodes 56 and 28 reaches V1off. This state indicates that the means for supplying a current to the node 56 has been interrupted, preventing the differential voltage between the voltages of the nodes 56 and 28 from becoming equal to or higher than V1off. That is, the voltage of the drain (node 56) of the on control transistor 43 with respect to the voltage of the source (node 28) of the output transistor 3 can be clipped at the fixed plus voltage V1off.

In summary, while the gate capacitances 11 and 12 of the output transistor 3 are being charged with a current, the first clip voltage exhibits a value slightly smaller than V1off. After the gate capacitances 11 and 12 of the output transistor 3 are completely charged, the first clip voltage reaches V1off. However, the size of the on control transistor 43 may be set to be greater so that the gate voltage of the on control transistor 43 has a value close to the threshold (VPUMP−V43*th*). By allowing a large current to be supplied to the gate capacitances 11 and 12 of the output transistor 3, it is possible to set the first clip voltage obtained while the gate capacitances 11 and 12 of the output transistor 3 are being charged, at a value almost equal to V1off.

Furthermore, in the first clip circuit 37, the input current to the node 28 is equivalent to the current flowing through the differential voltage sensing transistor 47. The latter current flows from the cathode of the diode 49 toward the node 28. After t1*b*, when the clip control is started, the current value is almost fixed at I1off. As is the case of V1off, the current value is slightly smaller than I1off while the gate capacitances 11 and 12 of the output transistor 3 are being charged. The current value reaches I1off after the gate capacitances 11 and 12 of the output transistor 3 have been completely charged.

Figure 6:
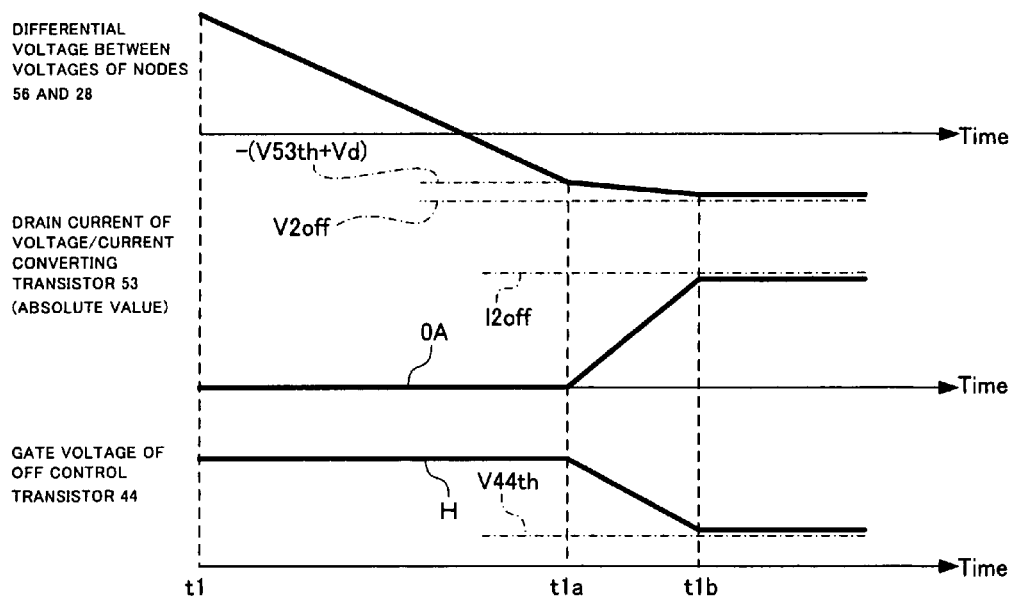
FIG. 6 is a time chart for a second clip circuit operation according to Embodiment 1 of the present invention.

Now, with reference to a time chart in FIG. 6, the operation of the second clip circuit 38 will be described. FIG. 6 shows the operation of the second clip circuit 38 after t1 on the assumption that at the initial t1, S1 and S2 are switched from the low level to the high level. It is also assumed that the output impedance of S2 is sufficiently low with respect to the resistance value of the resistor 46 and is thus negligible. It is further assumed that a current flows through the inductive load 15 in the a direction.

At the initial t1, the off control transistor 44 is turned on to drop the voltage of the node 56 to shift the differential voltage (the voltage of the node 56—the voltage of the node 28) between the voltages of the nodes 56 and 28 in a decrease direction. A gate-source threshold voltage for the voltage/current converting transistor 53 is defined as V53*th* (absolute value). A forward breakdown voltage for the diode 52 is defined as Vd. Then, when the differential voltage between the voltages of the nodes 56 and 28 is at least {−(V53*th*+Vd)}, the voltage/current converting transistor 53 is off. In this state, no current flows through the current mirror transistors 54 and 55. The gate voltage of the off control transistor 44 is thus the same as the voltage of S2 and is at the high level. In this state, the off control transistor 44 offers the lowest on resistance.

At t1*a*, the differential voltage between the voltages of the nodes 56 and 28 decreases down to {−(V53*th*+Vd)} to turn on the voltage/current converting transistor 53, which starts feeding a current. The current is input to the primary current mirror transistor 54, and a suction current is output to the secondary current mirror transistor 55. The current output to the secondary current mirror transistor 55 flows from S2 through the resistor 46, reducing the gate voltage of the off control transistor 44. A decrease in the differential voltage between the voltages of the nodes 56 and 28 increases the current flowing through the voltage/current converting transistor 53. Thus, the gate voltage of the off control transistor 44 decreases. This indicates an increase in the on resistance of the off control transistor 44. The drop in the voltage of the node 56 slows after t1*a*.

The differential voltage between the voltages of the nodes 56 and 28 obtained when the gate voltage of the off control transistor 44 drops down to a threshold thereof V44*th* is defined as V2off. At t1*b*, the differential voltage between the voltages of the nodes 56 and 28 drops close to V2off and then almost stops dropping. The operation after t1*b* corresponds to the clip control.

The operation after t1*b* is such that while the gate capacitances 11 and 12 of the output transistor 3 are discharging currents, the differential voltage between the voltages of the nodes 56 and 28 does not completely drop to V2off and exhibits a value slightly greater than V2off.

While the gate capacitances 11 and 12 of the output transistor 3 are discharging currents, the discharging current flows through the resistor 42 to the node 56. The voltage of the node 56 is thus lower than the gate voltage of the output transistor 3. In this state, if the differential voltage between the voltages of the nodes 56 and 28 drops down to V2off, the off control transistor 44 is completely turned off, interrupting the means for supplying a current to the node 56. This interrupts the discharging current flowing through the resistor 42 to the node 56. The interruption of the current flowing through the resistor 42 changes the voltage of the node 56 so that the voltage rises toward the gate voltage of the output transistor 3. The rise in the voltage of the node 56 raises the differential voltage between the voltages of the nodes 56 and 28. The differential voltage between the voltages of the nodes 56 and 28 exhibits a value greater than V2off. This turns on the off control transistor 44 again.

When the off control transistor 44 is turned on again, a current is supplied to the node 56 and the discharging current flows through the resistor 42 to the node 56. The voltage of the node 56 thus changes so as to drop again.

The above control is such that after t1*b*, if the differential voltage between the voltages of the nodes 56 and 28 drops toward V2off, the differential voltage is raised. This negative feedback control drops the differential voltage between the voltages of the nodes 56 and 28 if the differential voltage has risen. In this case, the differential voltage between the voltages of the nodes 56 and 28 is balanced at a value slightly greater than V2off by appropriately setting gain and phase so as to prevent the system of a feedback loop from oscillating.

In summary, while the gate capacitances 11 and 12 of the output transistor 3 are discharging currents, the second clip voltage exhibits a value slightly greater than V2off. However, the size of the off control transistor 44 may be set to be greater so that the gate voltage of the off control transistor 44 has a value close to the threshold V44*th* for the gate voltage. By allowing a large current to be supplied to the gate capacitances 11 and 12 of the output transistor 3, it is possible to set the second clip voltage obtained while the gate capacitances 11 and 12 of the output transistor 3 are discharging currents, at a value almost equal to V2off.

Furthermore, in the second clip circuit 37, the input current to the node 28 is equivalent to the current flowing through the differential voltage sensing transistor 53. The latter current flows from the node 28 toward the anode of the diode 52. After t1*b*, when the clip control is started, the current value is slightly smaller than I2off while the gate capacitances 11 and 12 of the output transistor 3 are discharging.

Now, with reference to a time chart in FIG. 3, the turn-on switching operation of the output transistor 3 will be described. In the time chart in FIG. 3, it is assumed that in FIG. 2, the driving current is flowing through the inductive load 15 in the a direction and that the output transistor 4 is off. A clip voltage for the first clip circuit 37 is defined as V1clip. A current flowing from the cathode of the diode 49 toward the node 28 during a clip operation of the first clip circuit 37 is defined as I1clip. A clip voltage for the second clip circuit 38 is defined as V2clip. A current flowing from the node 28 toward the anode of the diode 52 during a clip operation of the second clip circuit 38 is defined as I2clip. As shown above, it is assumed that the values of V1clip and V2clip are set almost equal to those of V1off and V2off. This means that the values of I1clip and I2clip are set almost equal to those of I1off and I2off.

At the initial t0, the input signals S1 and S2 are at the high level. The gate voltage of the output transistor 3 is thus at the low level, and the output transistor 3 is off. A current flowing through the driving coil 15 in the a direction flows from the ground through the diode 8. The voltage of the source terminal (node 28) of the output transistor 3, which is the output terminal of the output transistor 3, is thus at the low level.

At t1, S1 and S2 are switched to the low level to turn on the on control transistor 43, while turning off the off control transistor 44. This raises the voltage of the node 56. However, the above described operation of the first clip circuit 37 clips the differential voltage (the voltage of the node 56—the voltage of the node 28) between the voltages of the nodes 56 and 28 at the fixed voltage V1clip. During the period from t1 to t2, the gate capacitances 11 and 12 of the output transistor are charged to raise the gate-source voltage (the gate voltage–the source voltage) of the output transistor 3.

At t2, the gate-source voltage of the output transistor 3 increases to allow the output transistor 3 to supply all the current flowing through the inductive load 15. The voltage of the node 28 then starts rising. The gate-source voltage of the output transistor 3 at this point in time is defined as Vhold. While the voltage of the node 28 is rising, the gate-source voltage of the output transistor 3 is smoothed at the fixed voltage Vhold. As shown above, smoothing of the gate-source voltage is a general property of MOS transistors. The voltage of the node 56 rises with the clip voltage V1clip maintained with respect to the voltage of the node 28.

At t3, the voltage of the node 28 rises completely up to the high level and then keeps the high level. The voltage of the node 56 is kept at a value determined by adding the clip voltage V1clip to the high level voltage of the node 28. After t3, the gate-source voltage of the output transistor 3 starts increasing again. At t4, the gate voltage of the output transistor rises up to the voltage of the node 56. Then, the increase in the gate-source voltage of the output transistor 3 stops.

Figure 18:
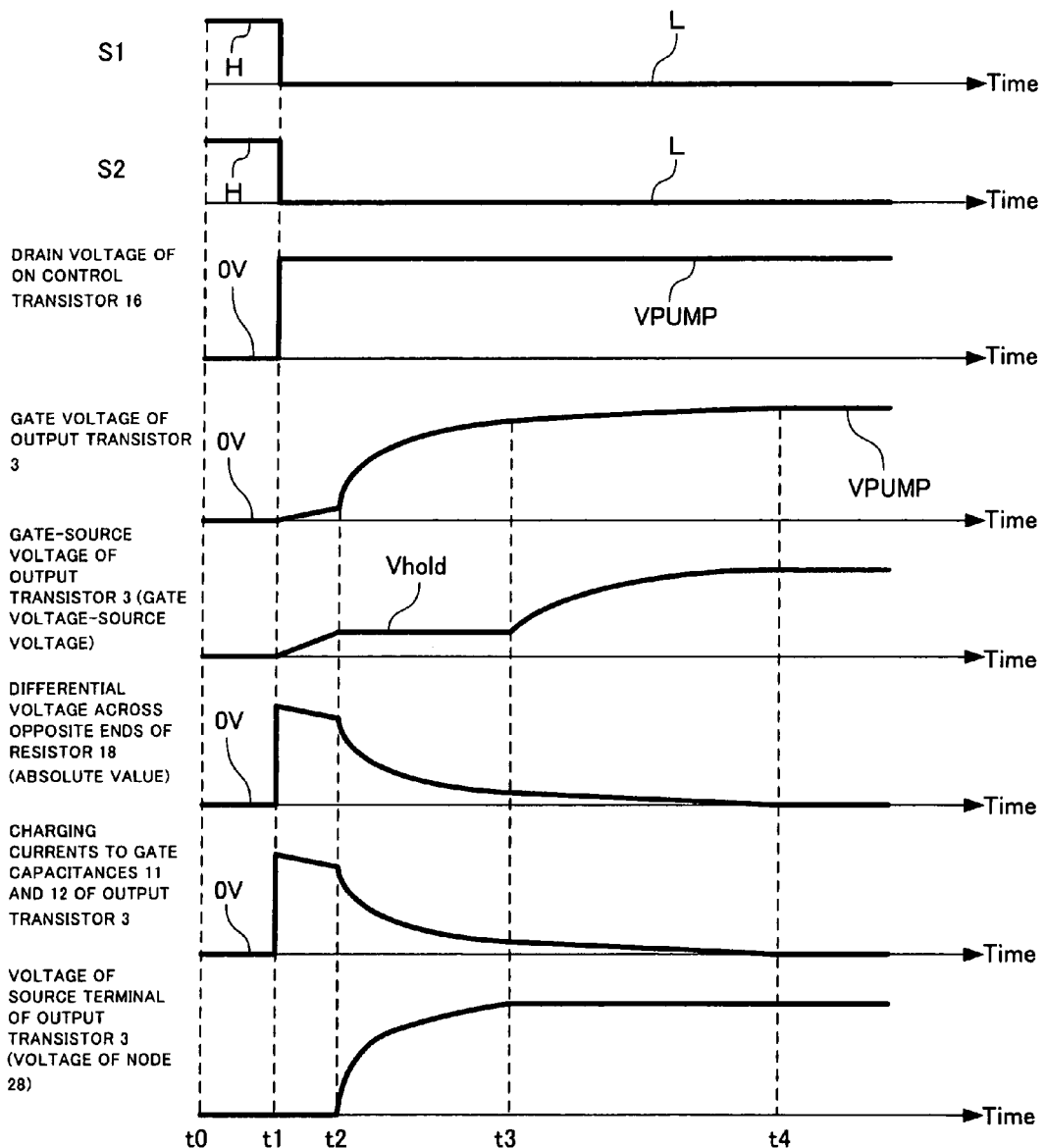
FIG. 18 is a time chart for a well-known switching operation (turn-on)

The time chart for the well-known conventional example shown in FIG. 18 shows that in the conventional example, when the voltage of the node 28 rises, the current charged into the gate capacitance of the output transistor 3 exhibits the value determined by the time constant, disadvantageously gradually reducing the charging current value and preventing the slew rate of the voltage of the node 28 from being properly controllable.

Figure 3:
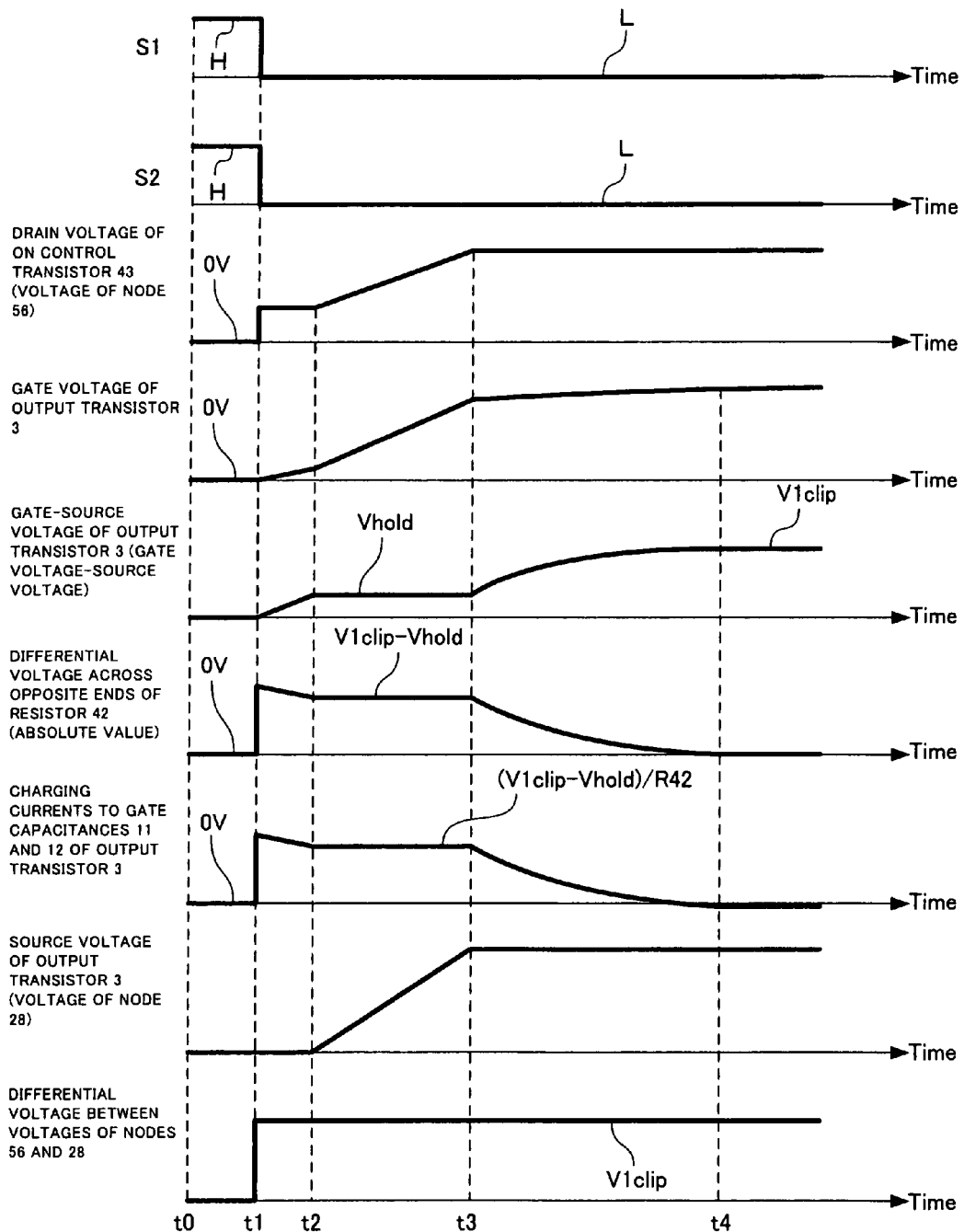
FIG. 3 is a time chart for a switching operation (turn-on) according to Embodiment 1 of the present invention.

According to the present embodiment shown in FIG. 3, during the period from t2 to t3, when the voltage of the node 28 rises, the voltages of the nodes 56 and 28 are clipped at V1clip, while the gate-source voltage of the output transistor 3 is smoothed at the fixed voltage Vhold. Thus, the voltage (absolute value) across the opposite ends of the resistor 42 exhibits a fixed value (V1clip−Vhold). V1clip is a plus voltage. That is, the charging current to the gate terminal of the output transistor 3 at this point in time is fixed at a value {(V1clip−Vhold)/R42}. Clearly, the voltage varies linearly when the capacitance is charged with the fixed current. The present embodiment enables a very linear slew rate to be achieved by inputting the fixed current to the gate capacitance during a turn-on rise in the output voltage of the output transistor 3.

Now, with reference to a time chart in FIG. 4, the turn-off switching operation of the output transistor 3 will be described. In the time chart in FIG. 4, it is assumed that in FIG. 2, the driving current is flowing through the inductive load 15 in the a direction and that the output transistor 4 is off.

At the initial t0, the input signals S1 and S2 are at the low level. The gate voltage of the output transistor 3 is thus at the high level, and the output transistor 3 is on. The voltage of the node 28 is at the high level.

At t1, S1 and S2 are switched to the low level to turn off the on control transistor 43, while turning on the off control transistor 44. This drops the voltage of the node 56. However, the above described operation of the second clip circuit clips the differential voltage (the voltage of the node 56—the voltage of the node 28) between the voltages of the nodes 56 and 28 at V2clip. During the period from t1 to t2, the gate capacitances 11 and 12 of the output transistor discharge to reduce the gate-source voltage (the gate voltage—the source voltage) of the output transistor 3.

At t2, the gate-source voltage of the output transistor 3 decreases down to the voltage Vhold. The voltage of the node 28 then starts dropping. While the voltage of the node 28 is dropping, the gate-source voltage of the output transistor 3 is smoothed at the fixed voltage Vhold. As described above, smoothing of the gate-source voltage is a general property of MOS transistors. The voltage of the node 56 drops with the clip voltage V2clip maintained with respect to the voltage of the node 28.

At t3, the drain voltage of the off control transistor 44 drops to the low level. The clip control is then cancelled, and the differential voltage between the voltages of the nodes 56 and 28 starts increasing.

At t4, the voltage of the node 28 drops completely down to the low level and then keeps the low level. After t4, the gate-source voltage of the output transistor 4 starts decreasing again. At t5, the gate voltage of the output transistor 3 drops completely down to the low level. Then, the decrease in the gate-source voltage of the output transistor 3 stops.

The time chart for the well-known conventional example shown in FIG. 19 shows that in the conventional example, when the voltage of the node 28 drops, the current discharged from the gate capacitance of the output transistor 3 exhibits the value determined by the time constant, disadvantageously gradually reducing the current value and preventing the slew rate of the voltage of the node 28 from being properly controllable.

Figure 4:
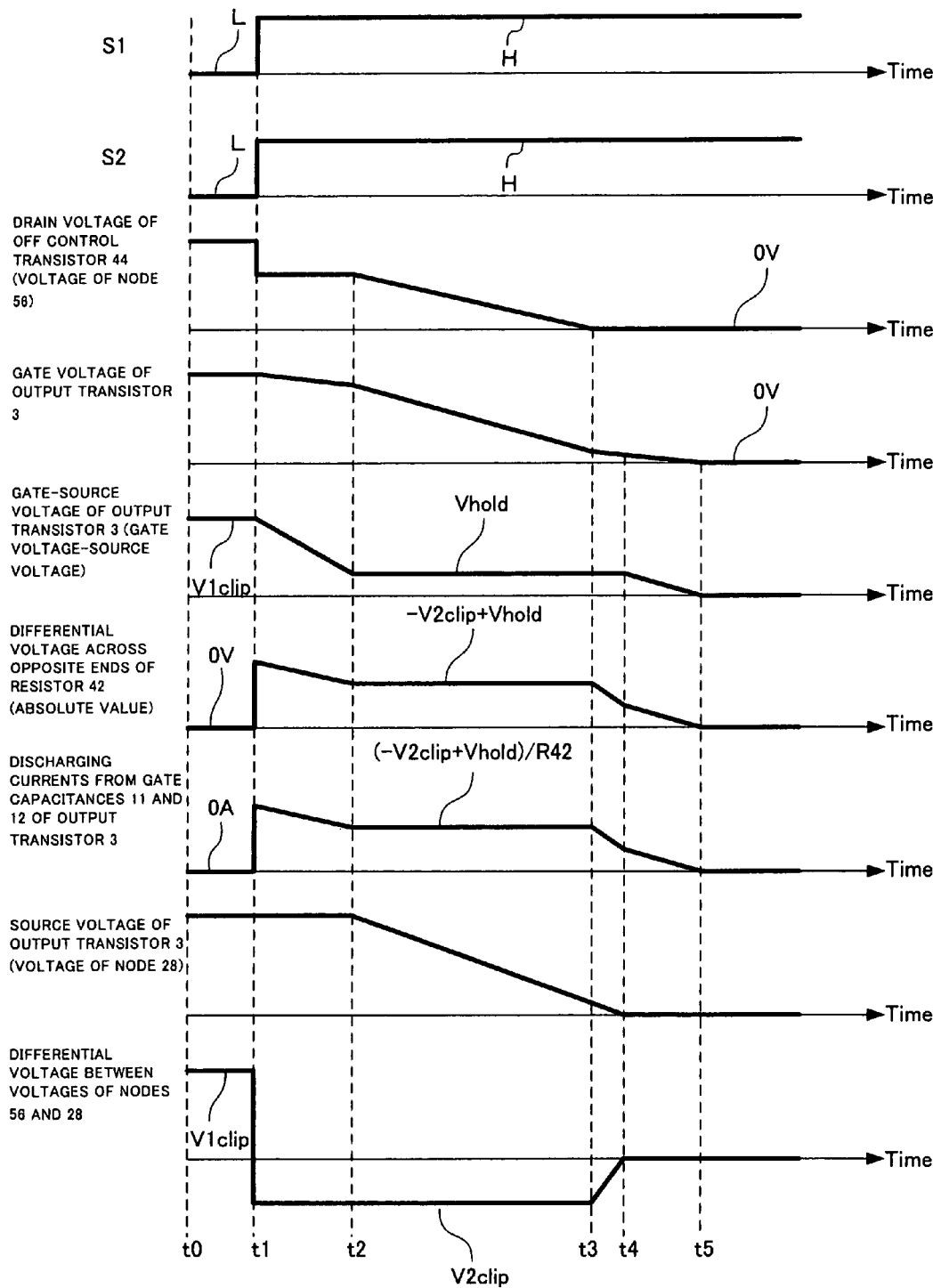
FIG. 4 is a time chart for a switching operation (turn-off) according to Embodiment 1 of the present invention.

According to the present embodiment shown in FIG. 4, the period during t2 and t3 and a period from t3 to t4 correspond to the period during which the voltage of the node 28 drops.

During the period from t2 to t3, the differential voltage between the voltages of the nodes 56 and 28 is clipped at V2clip, while the gate-source voltage of the output transistor 3 is smoothed at the fixed voltage Vhold. Thus, the voltage (absolute value) across the opposite ends of the resistor 42 exhibits a fixed value (−V2clip+Vhold). V2clip is a minus voltage. That is, the discharging current from the gate terminal of the output transistor 3 at this point in time is fixed at a value {(−V2clip+Vhold)/R42}. Clearly, the voltage varies linearly when the capacitance discharges the fixed current. A very linear slew rate can thus be achieved during the period from t2 to t3.

During the period from t3 to t4, the clip control is cancelled at t3, preventing the discharging current from the gate terminal from being fixed. Thus, in spite of the non-linearity until t4, the uncontrollability of the slew rate during the period from t3 to t4 is made almost negligible by setting the absolute value of the clip voltage V2clip at a sufficiently small value to set the period from t3 to t4 shorter.

Another effect of the first clip circuit 37 and the second clip circuit 38 is breakdown protection of the forward and backward voltages between the gate and source of the output transistor 3.

While the output transistor 3 is on, the voltage of the gate terminal of the output transistor 3 does not rise to or above the voltage of the node 56 because the voltage of the gate terminal is raised by a current provided by the node 56. The first clip circuit 37 clips the voltage of the node 56 at the fixed plus voltage with respect to the voltage of the node 28. This is effective for clipping the gate voltage of the output transistor 3 at the fixed plus voltage with respect to the source voltage (the voltage of the node 28) of the output transistor 3.

Similarly, while the output transistor 3 is off, the voltage of the gate terminal of the output transistor 3 does not drop down to the voltage of the node 56 because the voltage of the gate terminal is dropped by the discharge of a current to the node 56. The second clip circuit 38 clips the voltage of the node 56 at a fixed minus voltage with respect to the voltage of the node 28. This is effective for clipping the gate voltage of the output transistor 3 at the fixed minus voltage with respect to the source voltage (the voltage of the node 28) of the output transistor 3. The gate-source backward voltage protection diode 21 in FIG. 17 is unnecessary for Embodiment 1, having the second clip circuit 38.

That is, the first clip voltage of the first clip circuit 37 is set equal to or lower than a breakdown voltage for the gate-source forward voltage of the output transistor 3. The second clip voltage of the second clip circuit 38 is set equal to or lower than a breakdown voltage for the gate-source backward voltage of the output transistor 3. This makes it possible to provide gate-source breakdown protection for the output transistor 3.

The present invention requires that only the first and second clip circuits 37 and 38 and resistors 45 and 46 be added to the configuration of the well-known conventional example in FIG. 17. The first and second clip circuits can be configured to have small circuit scales as shown in FIG. 2. Furthermore, the resistor 42 and the first and second clip voltages enable the setting of the values of the currents charged into and discharged from the gate terminal of the output transistor 3 during the turn-on and turn-off operations. The slew rate can thus be controlled without the need to add an external current setting terminal.

That is, Embodiment 1 makes it possible to provide a switching control system which allows the desired slew rate to be easily obtained and which has a reduced price and a reduced size, the switching control system being applicable to output transistors of various sizes.

Embodiment 2

Figure 7:
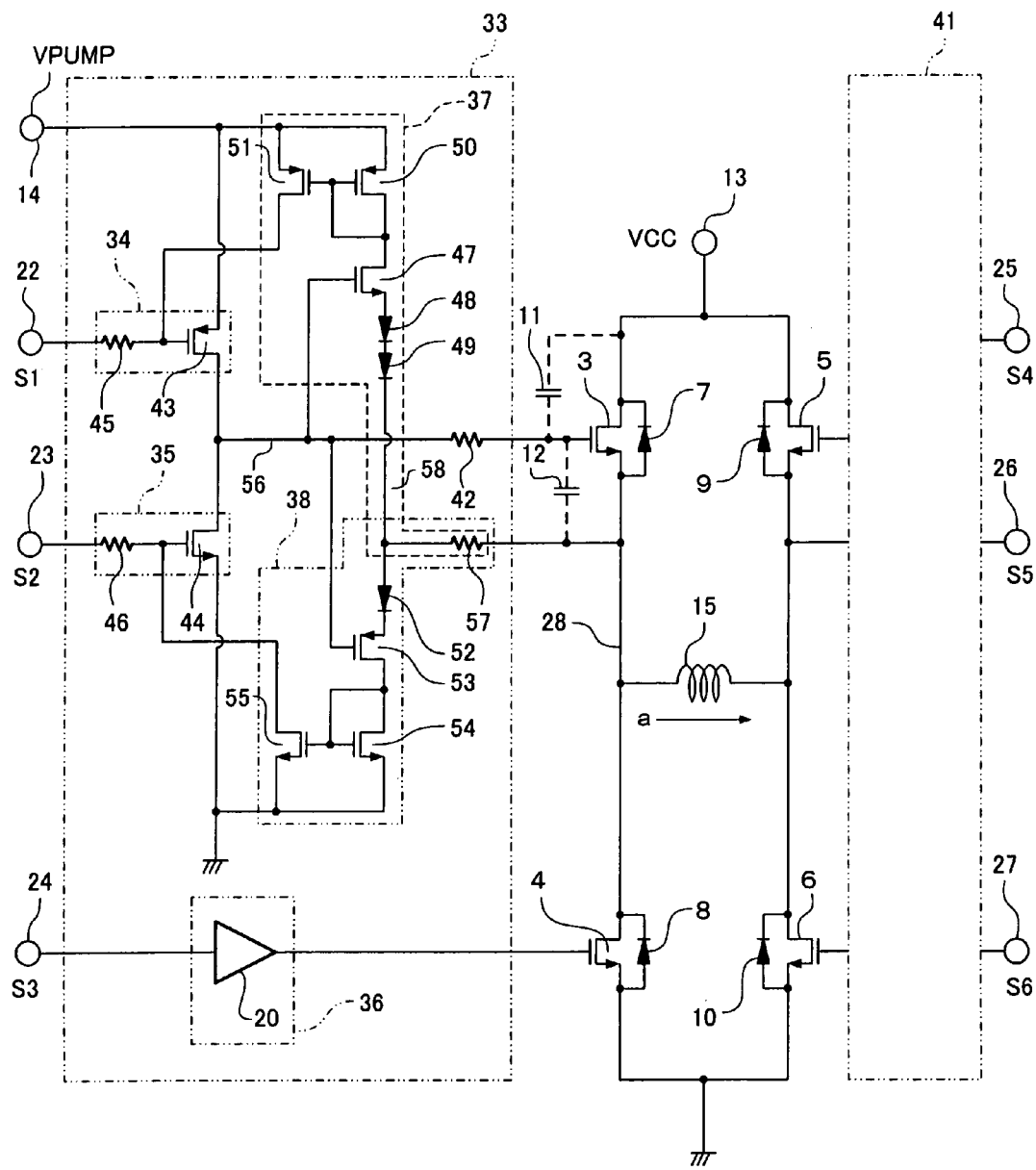
FIG. 7 is a specific circuit diagram of a switching control system according to Embodiment 2 of the present invention.

FIG. 7 shows a circuit diagram of Embodiment 2 of the present invention. FIG. 7 shows a configuration corresponding to that of Embodiment 1 to which a resistor 57 is added. In the configuration in FIG. 7, the clip voltage setting circuit in the first clip circuit 37 is composed of the diodes 48 and 49 and the resistor 57. The clip voltage setting circuit in the second clip circuit 38 is composed of the diode 52 and the resistor 57. The resistor 57 is connected between the diode 49 and the diode 52 and the node 28. The remaining part of the configuration is the same as that of Embodiment 1, shown in FIG. 2, and will thus not be described below.

In the configuration according to Embodiment 1, the first clip voltage, determined by the first clip circuit 37, is the fixed plus voltage V1clip. During the clip control, the current I1clip flows from the cathode of the diode 49 toward the node 28. In contrast, in the configuration according to Embodiment 2, shown in FIG. 7, the resistor 57 is added to the node 28, setting the first clip voltage for the node 56 with respect to the voltage of the node 28, equal to {V1clip+(I1clip*R57)}.

Furthermore, in the configuration according to Embodiment 1, the second clip voltage, determined by the second clip circuit 38, is the fixed minus voltage V2clip. During the clip control, the current I2clip flows from the node 28 toward the diode 52. In contrast, in the configuration according to Embodiment 2, shown in FIG. 7, the resistor 57 is added to the node 28, setting the second clip voltage for the node 56 with respect to the voltage of the node 28, equal to {V2clip−(I2clip*R57)}.

That is, the clip voltages of the first clip circuit 37 and the second clip circuit 38 can be set by utilizing the fixed currents input to the respective clip circuits 37 and 38 during the clip operation and connecting the resistor 57 to the clip circuits 37 and 38.

This means the following to the predrive circuit 33. The predrive circuit 33 can be generally used to drive output transistors made in accordance with various specifications, by forming the elements other than the resistor 42 and the resistor 57 into a semiconductor integrated circuit and releasing the node 56 and the node 58 as external terminals. For example, the first clip voltage and the second clip voltage are set on the basis of a value for the external resistor 57 in accordance with the breakdown voltage value for the voltage between the gate and source of the output transistor and the breakdown voltage for the reverse voltage. Moreover, the slew rate can be optionally set at any value on the basis of the value for the external resistance 42.

Embodiment 3

Figure 8:
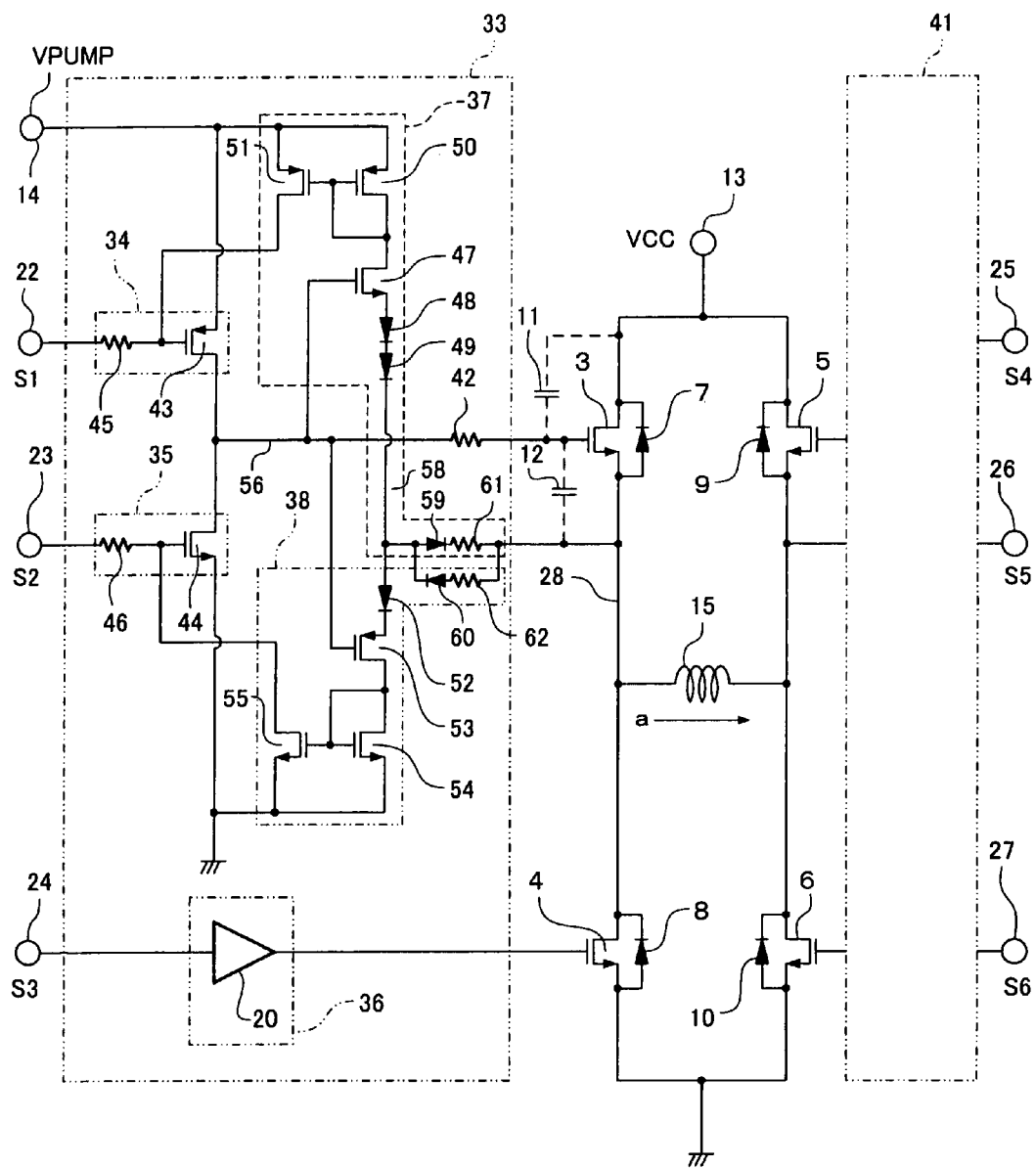
FIG. 8 is a specific circuit diagram of a switching control system according to Embodiment 3 of the present invention.

FIG. 8 shows a circuit diagram of Embodiment 3 of the present invention. FIG. 8 shows a configuration corresponding to that of Embodiment 1 to which diodes 59 and 60 and resistors 61 and 62 are added. In the configuration in FIG. 8, the clip voltage setting circuit in the first clip circuit 37 is composed of the diodes 48, 49, and 59 and the resistor 61 and connected to the node 28. The clip voltage setting circuit in the second clip circuit 38 is composed of the diodes 52 and 60 and the resistor 62 and connected to the node 28.

In Embodiment 3, when a forward breakdown voltage for the diode 59 is defined as V59d and the internal impedance of the diode 59 is sufficiently low compared to that of the resistor 61 and is negligible, the first clip voltage for the node 56 with respect to the voltage of the node 28 can be set equal to {V1clip+V59d+(I1clip*R61)}.

When a forward breakdown voltage for the diode 60 is defined as V60d and the internal impedance of the diode 60 is sufficiently low compared to that of the resistor 62 and is negligible, the second clip voltage for the node 56 with respect to the voltage of the node 28 can be set equal to {V2clip−V60d−(I2clip*R62)}.

This means the following. In the predrive circuit 33, the elements other than the resistor 42, diode 59, diode 60, resistor 61, and resistor 62 are formed into a semiconductor integrated circuit. The node 56 and the node 58 are then released as external terminals. This enables the first clip voltage and the second clip voltage to be independently set from the external terminals. This configuration provides a higher degree of freedom in setting the breakdown voltage and the slew rate and can be used for more various applications, than that of Embodiment 2.

Embodiment 4

Figure 9:
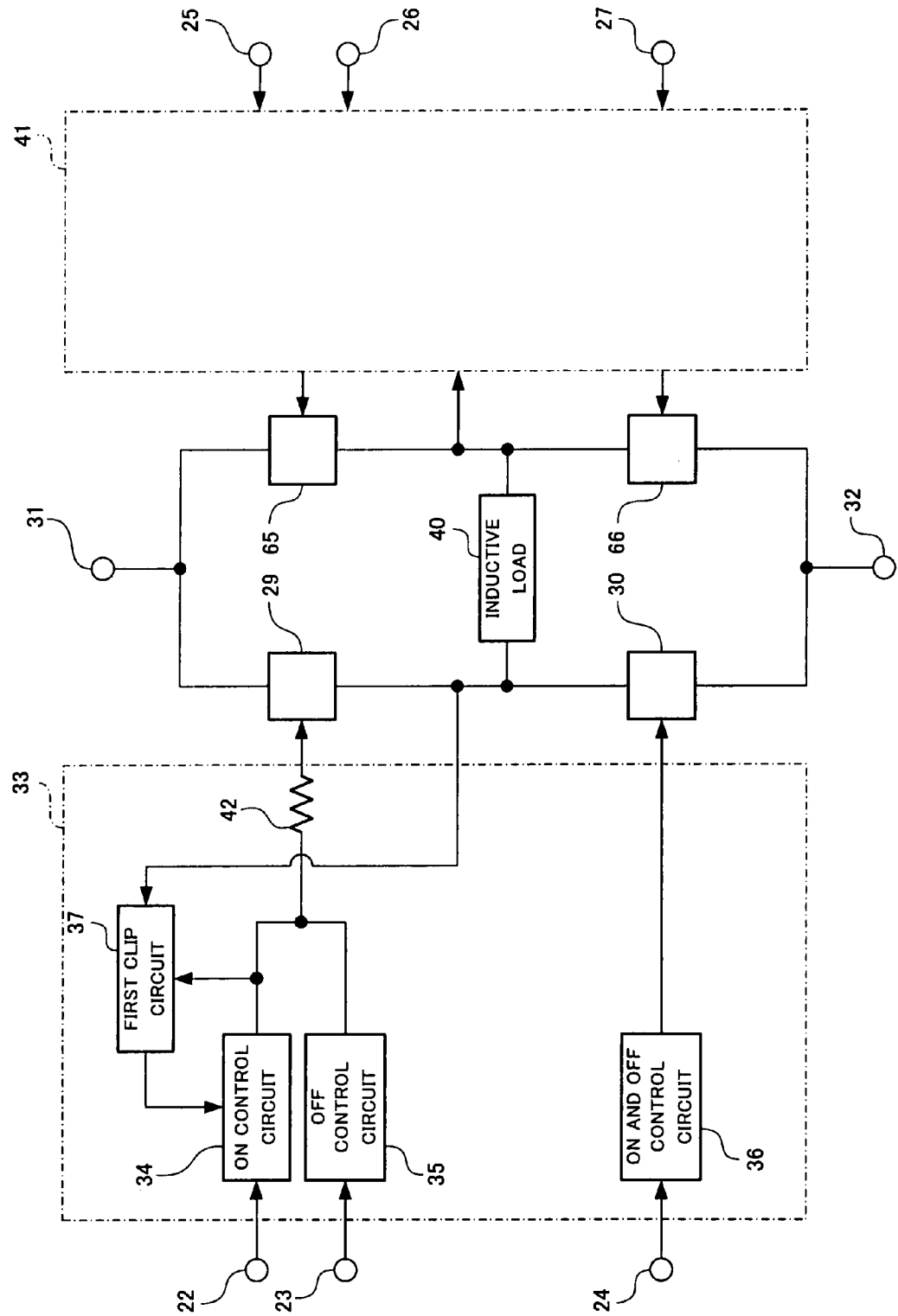
FIG. 9 is a block diagram of a switching control system according to Embodiment 4 of the present invention.

FIG. 9 shows a block diagram of Embodiment 4 of the present embodiment. FIG. 9 shows a configuration corresponding to that of Embodiment 1 from which the second clip circuit is omitted.

Embodiment 5

Figure 10:
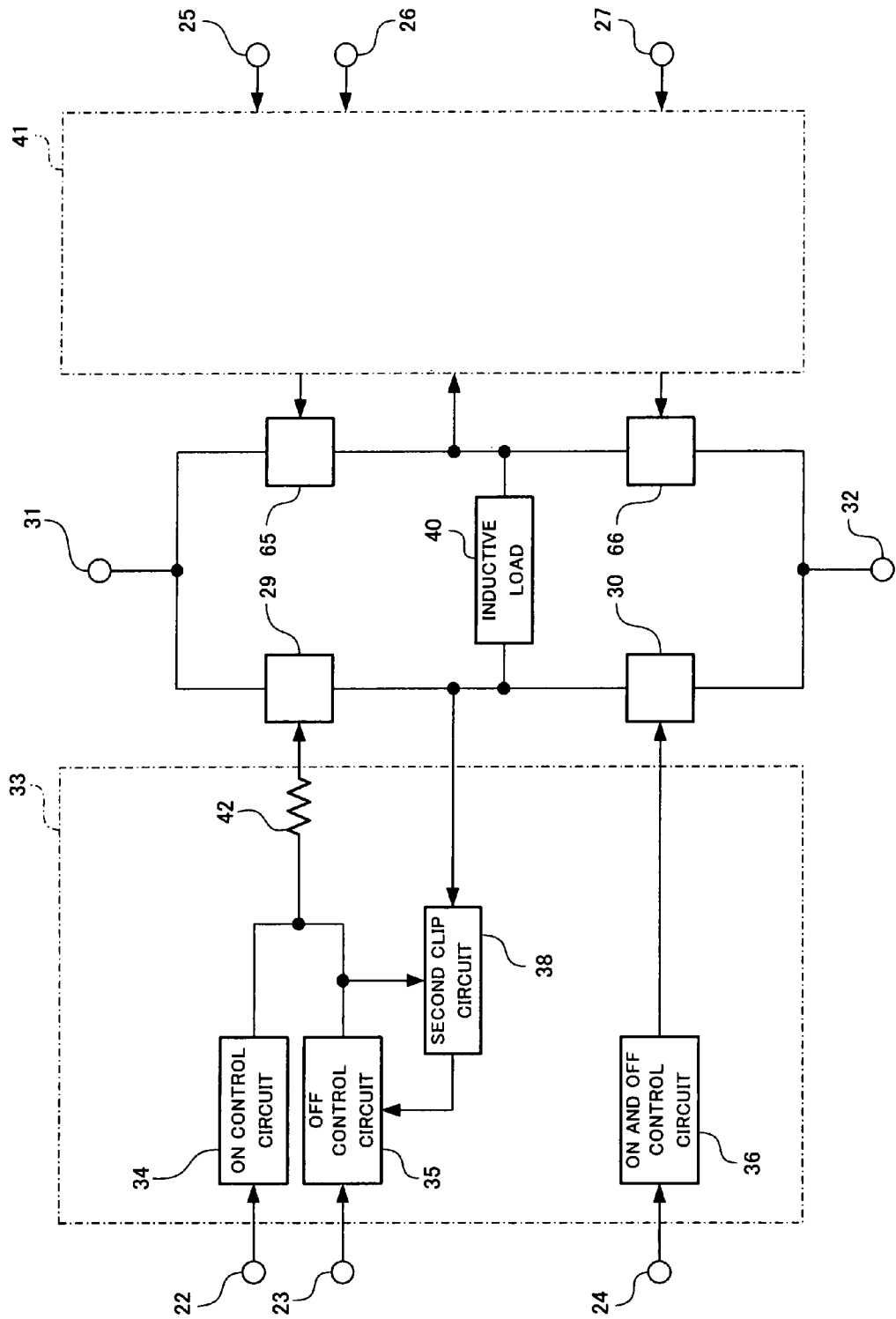
FIG. 10 is a block diagram of a switching control system according to Embodiment 5 of the present invention.

FIG. 10 shows a block diagram of Embodiment 5 of the present embodiment. FIG. 10 shows a configuration corresponding to that of Embodiment 1 from which the first clip circuit is omitted.

Embodiments 4 and 5 are effective if for one of the breakdown voltage and slew rate of the output transistor 3, focus is to be placed on one of the control of the turn-on operation and the control of the turn-off operation.

Embodiment 6

Figure 11:
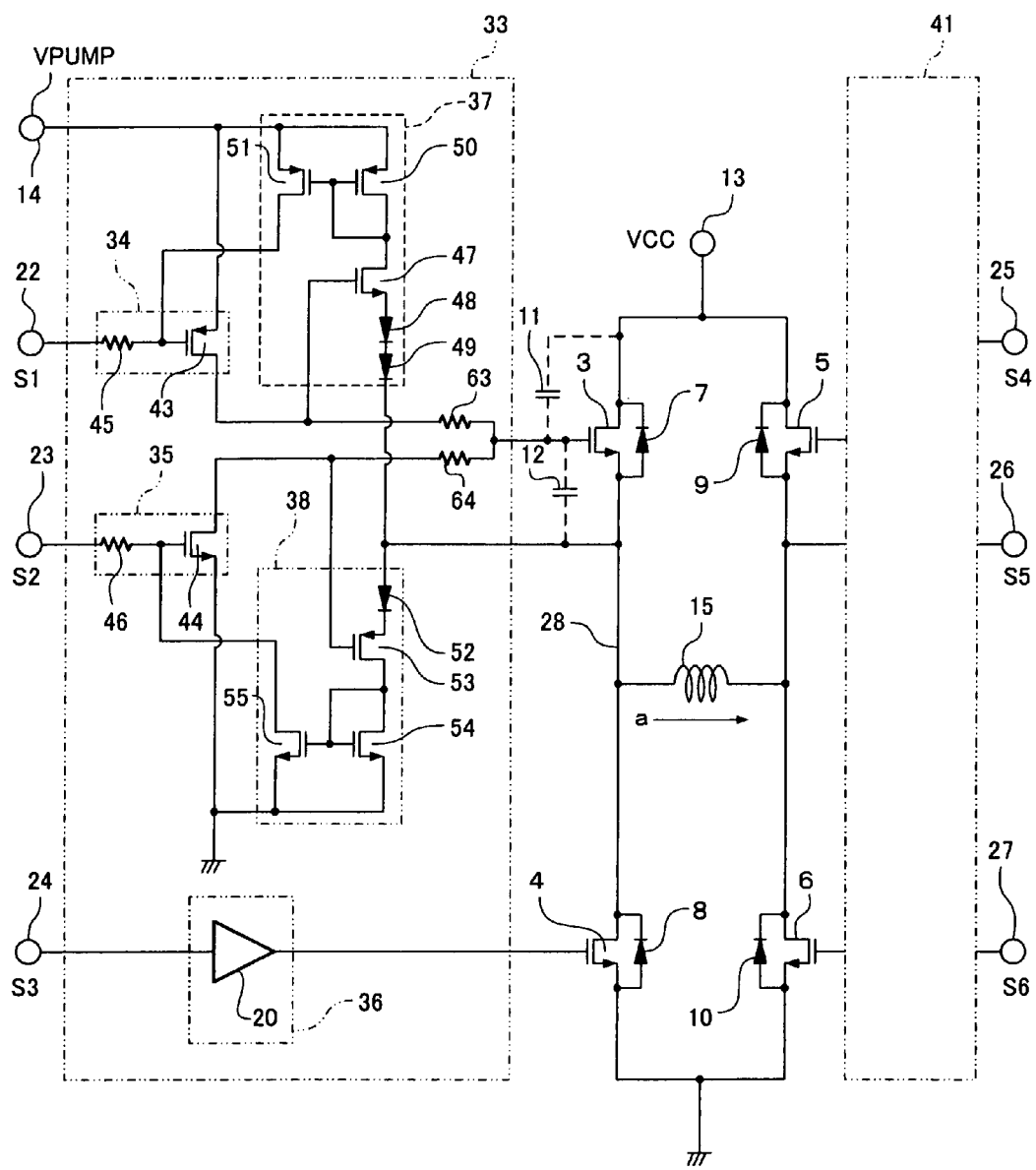
FIG. 11 is a specific circuit diagram of a switching control system according to Embodiment 6 of the present invention.

FIG. 11 shows a specific circuit diagram for Embodiment 6 of the present invention. FIG. 11 shows a configuration corresponding to that of Embodiment 1 from which the common resistor 42 is deleted and in which the resistor 63 for on control and the resistor 64 for off control are independently provided between the gate of the output transistor 3 and the on control circuit 34 and the off control circuit 35. The remaining part of the configuration is the same as that of Embodiment 1, shown in FIG. 2, and will thus not be described below.

The first clip voltage is defined as V1clip, and the second clip voltage is defined as V2clip. The gate-source voltage obtained at a limit point at which the output transistor 3 can supply all the current flowing through the inductive load 15 is defined as Vhold. The charging current to the gate terminal during a rise in the voltage of the node 28 during the turn-on operation of the output transistor 3 is fixed at a value $\{(V1clip-Vhold)/R63\}$. The discharging current from the gate terminal during a drop in the voltage of the node 28 during the turn-off operation of the output transistor 3 is fixed at a value $\{(-V2clip+Vhold)/R64\}$. Owing to the ability to optionally vary the values for the resistors 63 and 64, Embodiment 6 provides a much higher degree of freedom in setting the slew rate of the output voltage.

Embodiment 7

Figure 12:
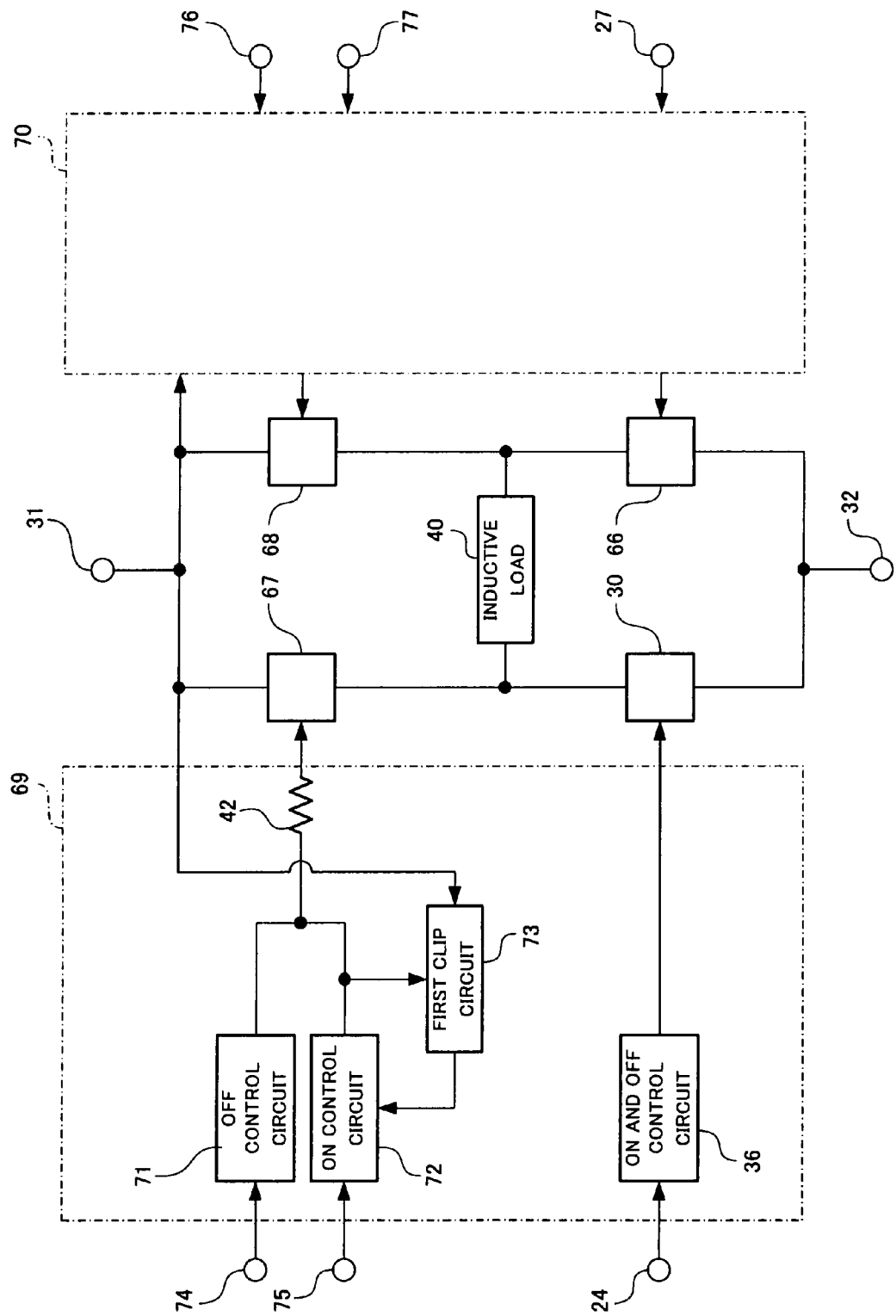
FIG. 12 is a block diagram of a switching control system according to Embodiment 7 of the present invention.

FIG. 12 shows a block diagram of Embodiment 7 of the present invention. In FIG. 12, output transistors 67 and 68 are P-type MOS transistors, and the output transistors 30 and 66 are N-type MOS transistors. Reference numerals 31 and 32 denote the first and second power supply terminals. Reference numeral 69 denotes a predrive circuit that drives the output transistors 67 and 30. Reference numeral 40 denotes the inductive load to be driven. A source terminal of the output transistor 67 is connected to the first power supply terminal 31. A source terminal of the output transistor 30 is connected to the second power supply terminal 32. The predrive circuit 69 is composed of an on control circuit 72 that turns on the output transistor 67, an off control circuit 71 that turns off the output transistor 67, the on and off control circuit 36 that turns on and off the output transistor 30, a first clip circuit 73 that clips the voltage of an output terminal of the on control circuit 72 at any voltage with respect to the voltage of the source terminal of the output transistor 67, and the resistor 42 that sets a turn-on and turn-off switching speed for the output transistor 67. Thus, in Embodiment 7, the output transistors and the predrive circuit are provided at each of the opposite ends of the inductive loads to be driven.

Figure 13:
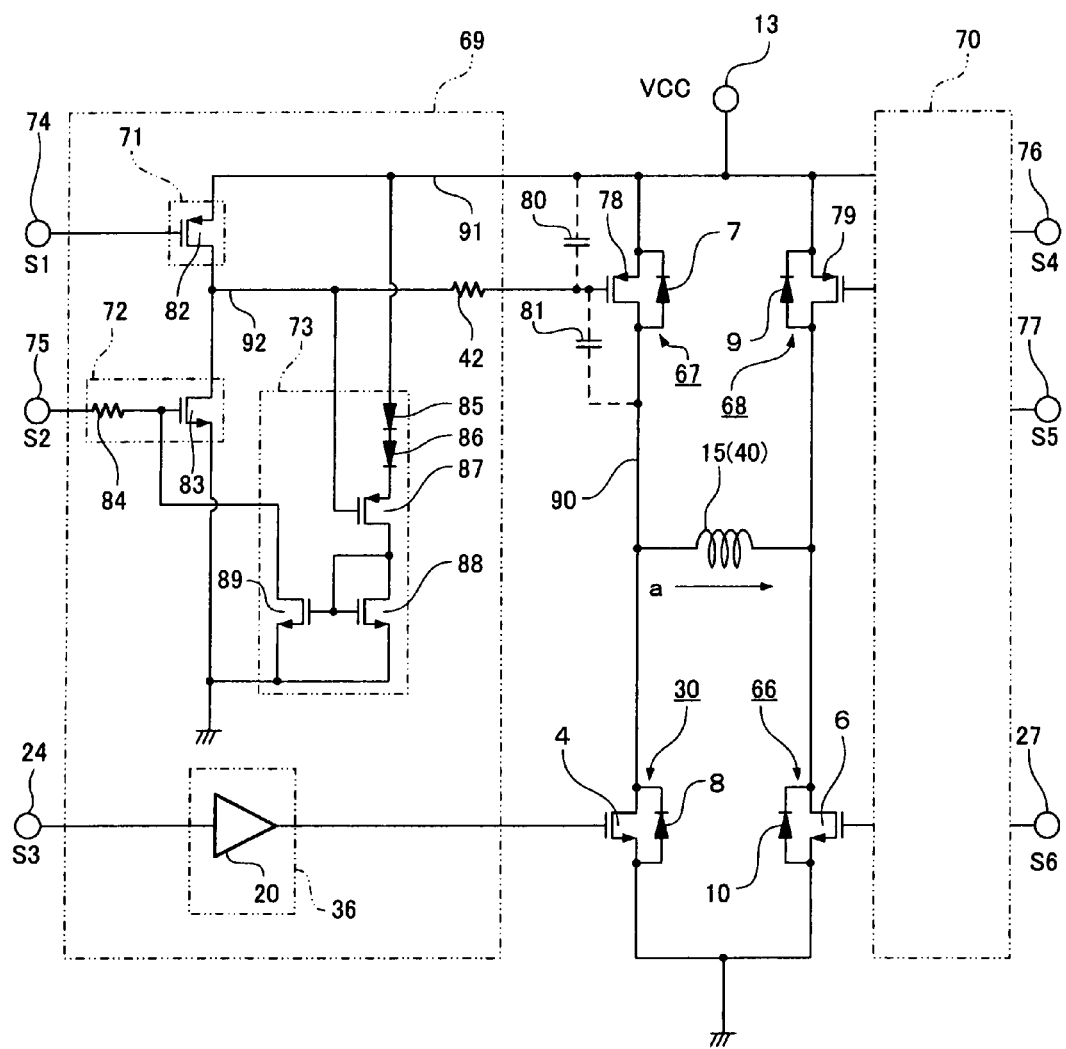
FIG. 13 is a specific circuit diagram of the switching control system according to Embodiment 7 of the present invention.

FIG. 13 shows a specific example of the circuit configuration. Reference numerals 4, 6 to 10, 13, 15, 20, 24, 27, and 36 in FIG. 13 denote the same components as those of Embodiment 1, shown in FIG. 2. The description of the components is thus omitted.

Reference numerals 69 and 70 denotes predrive circuits that control switching of a set of an output transistor 78 and the output transistor 4 and a set of an output transistors 79 and the output transistor 6, respectively. The output transistors 78 and 79 are P-type MOS transistors. Reference numeral 81 denotes a gate-drain parasitic capacitance in the output transistor 78. Reference numeral 80 denotes a gate-source parasitic capacitance in the output transistor 78. The parasitic capacitances are similarly present in the output transistor 79 (not shown). Since the predrive circuits 69 and 70 have the same internal circuit, the internal circuit of the predrive circuit 69 will be described below.

The off control circuit 71 is made of an off control transistor 82, and a gate terminal of the off control transistor is connected to an input terminal 74. The on control circuit 72 is composed of an on control transistor 83 and a resistor 84. One end of the resistor 84 is connected to a gate of the on control transistor 83. The other end of the resistor 84 is connected to an input terminal 75. The off control transistor 82 and the on control transistor 83 are connected in series between the power supply terminal 13 and the ground. The resistor 42 for setting the slew rate is connected between a gate terminal of the output transistor 78 and a connection point (node 92) between a drain terminal of the off control transistor 82, that is, an output terminal of the off control transistor 82, and a drain terminal of the on control transistor 83, that is, an output terminal of the on control transistor 83. A node 91 is for a source terminal of the output transistor 78. A node 90 is for a drain terminal of the output transistor 78, that is, an output terminal of the output transistor 78.

Applying the input signal S1 to the input terminal 74 operates the off control transistor 82. Applying the input signal S2 to the input terminal 75 operates the on control transistor 83. Input terminals 76 and 77 of the predrive circuit 70 correspond to the input terminals 74 and 75 of the predrive circuit 69, respectively. The input signals S4 and S5 are applied to the input terminals 76 and 77, respectively.

The first clip circuit 73 is composed of a voltage/current converting transistor 87, clip voltage setting diodes 85 and 86, and current mirror transistors 88 and 89. A gate of the voltage/current converting transistor 87 is connected to the node 92. A source of the voltage/current converting transistor 87 is connected to a cathode of the diode 86. A drain of the voltage/current converting transistor 87 is connected to the primary current mirror transistor 88. The secondary current mirror transistor 89 is connected to the gate terminal of the on control transistor 83. The first clip circuit 73 configured as described above uses a differential voltage sensing circuit (the voltage/current converting transistor 87 and the clip voltage setting diodes 85 and 86) to sense the differential voltage between the voltage of the source terminal (node 91) of the output transistor 78 and the voltage of the drain terminal (node 92) of the on control transistor 83. An output signal from the differential voltage sensing circuit is fed back to the gate terminal of the on control transistor 83 by a feedback circuit (current mirror transistors 88 and 89).

Specifically, the clip voltage setting diodes 85 and 86 set the first clip voltage. In accordance with the set first clip voltage, the voltage/current converting transistor 87 converts the differential voltage between the voltage of the source terminal of the output transistor 78 and the voltage of the drain terminal of the on control transistor 83 into a current and outputs the current. The output current resulting from the conversion is input to the primary current mirror transistor 88. The secondary current mirror transistor 89 outputs a current corresponding to a mirror ratio for the primary current mirror transistor 88. The current output by the secondary current mirror transistor 89 is fed back to the gate terminal of the on control transistor 83.

The clip voltage setting diodes 85 and 86 constitute a first clip voltage setting circuit in the first clip circuit 73. The diodes are not necessarily required for the desired clip voltage value. Alternatively, the first clip voltage can be freely varied by using any combinatory circuit including a Zener diode or a resistor or a diode, a Zener diode, and a resistor.

Figure 14:
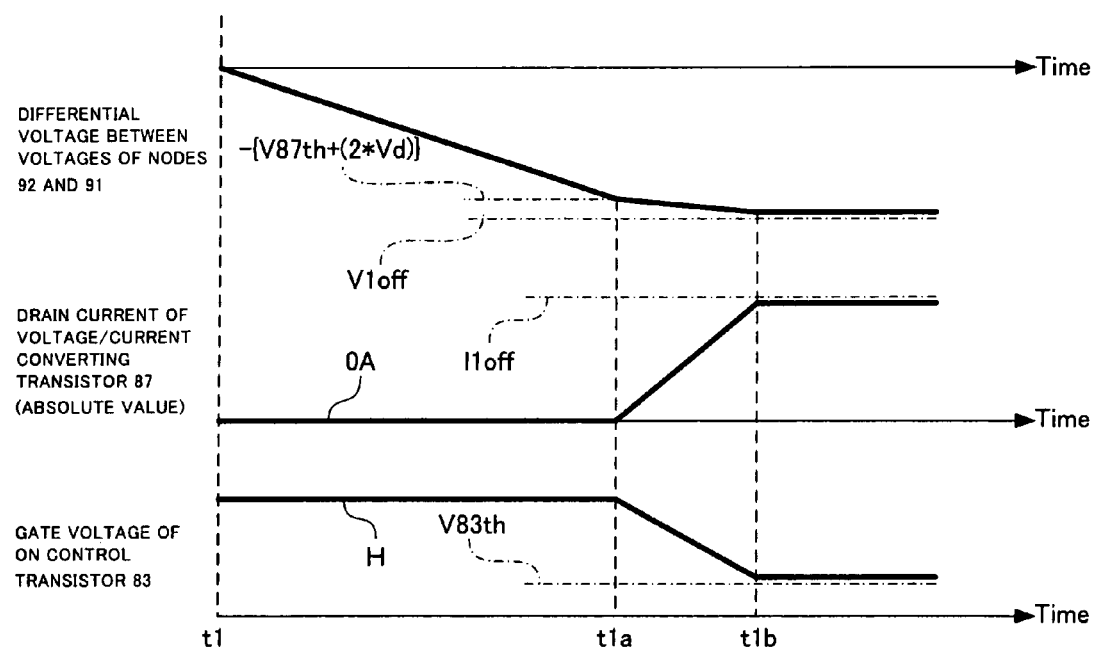
FIG. 14 is a time chart for a first clip circuit operation according to Embodiment 7 of the present invention.

First, with reference to a time chart in FIG. 14, the operation of the first clip circuit 73 will be described. FIG. 14 shows the operation of the first clip circuit 73 after t1 on the assumption that at the initial t1, S1 and S2 are switched from the low level to the high level. It is also assumed that the output impedance of S2 is sufficiently low with respect to the resistance value of the resistor 84 and is thus negligible. It is further assumed that a current flows through the inductive load 15 in the a direction.

At the initial t1, the on control transistor 83 is turned on to drop the voltage of the node 92 to shift the differential voltage (the voltage of the node 92—the voltage of the node 91) between the voltages of the nodes 92 and 91 in a decrease direction. A gate-source threshold voltage (absolute value) for the voltage/current converting transistor 87 is defined as V87$th$. A forward breakdown voltage for the diodes 85 and 86 is defined as Vd. Then, when the differential voltage between the voltages of the nodes 92 and 91 is at least [−{V87$th$+(2*Vd)}], the voltage/current converting transistor 87 is off. In this state, no current flows through the current mirror transistors 88 and 89. The gate voltage of the on control transistor 83 is thus the same as the voltage of S2 and is at the high level. In this state, the on control transistor 83 offers the lowest on resistance.

At t1$a$, the differential voltage between the voltages of the nodes 92 and 91 decreases down to [{V87$th$+(2*Vd)}] to turn on the voltage/current converting transistor 87, which starts feeding a current. The current is input to the primary current mirror transistor 88, and a suction current is output to the secondary current mirror transistor 89. The current output to the secondary current mirror transistor 89 flows from S2 through the resistor 84, reducing the gate voltage of the on control transistor 83. A decrease in the differential voltage between the voltages of the nodes 92 and 91 increases the current flowing through the voltage/current converting transistor 87. Thus, the gate voltage of the on control transistor 83 decreases. This indicates an increase in the on resistance of the on control transistor 83. The drop in the voltage of the node 92 slows after t1$a$.

The differential voltage between the voltages of the nodes 92 and 91 obtained when the gate voltage of the on control transistor 83 drops down to a threshold thereof V83$th$ is defined as V1off. At t1$b$, the differential voltage between the voltages of the nodes 92 and 91 drops close to V1off and then almost stops dropping. The operation after t1$b$ corresponds to the clip control.

The operation after t1$b$ is such that while the gate capacitances 80 and 81 of the output transistor 78 are discharging currents, the differential voltage between the voltages of the nodes 92 and 91 does not completely drop to V1off and exhibits a value slightly greater than V1off. After the discharge from the gate capacitances 80 and 81 of the output transistors 78 completes, the differential voltage between the voltages of the nodes 92 and 91 completely reaches V1off. A specific operation after t1$b$ is shown below.

While the gate capacitances 80 and 81 of the output transistor 78 are discharging currents, the discharging current flows through the resistor 42 to the node 92. The voltage of the node 92 is thus lower than the gate voltage of the output transistor 78. In this state, if the differential voltage between the voltages of the nodes 92 and 91 drops down to V1off, the on control transistor 83 is completely turned off, interrupting the means for supplying a current to the node 92. This interrupts the discharging current flowing through the resistor 42 to the node 92. The interruption of the current flowing through the resistor 42 changes the voltage of the node 92 so that the voltage rises toward the gate voltage of the output transistor 78. The rise in the voltage of the node 92 raises the differential voltage between the voltages of the nodes 92 and 91. The differential voltage between the voltages of the nodes 92 and 91 exhibits a value greater than V1off. This turns on the on control transistor 83 again.

When the on control transistor 83 is turned on again, a current is supplied to the node 92 and the discharging current flows through the resistor 42 to the node 92. The voltage of the node 92 thus changes so as to drop again.

The above control is such that after t1$b$, if the differential voltage between the voltages of the nodes 92 and 91 drops toward V1off, the differential voltage is raised. This negative feedback control drops the differential voltage between the voltages of the nodes 92 and 91 if the differential voltage has risen. In this case, the differential voltage between the voltages of the nodes 92 and 91 is balanced at a value slightly greater than V1off by appropriately setting gain and phase so as to prevent the system of a feedback loop from oscillating.

After the gate capacitances 80 and 81 of the output transistor 78 are completely discharged, that is, when the voltage of the node 92 becomes completely equal to the gate voltage of the output transistor 78, the differential voltage between the voltages of the nodes 92 and 91 reaches V1off. This state indicates that the means for supplying a current to the node 92 has been interrupted, preventing the differential voltage between the voltages' of the nodes 92 and 91 from becoming equal to or higher than V1off. That is, the voltage of the drain (node 92) of the on control transistor 83 with respect to the voltage of the source (node 91) of the output transistor 78 can be clipped at the fixed minus voltage V1off.

In summary, while the gate capacitances 80 and 81 of the output transistor 78 are discharging currents, the first clip voltage exhibits a value slightly greater than V1off. The first clip voltage reaches V1off after the discharge of the gate capacitances 80 and 81 of the output transistor 78 has completed. However, the size of the on control transistor 83 may be set to be greater so that the gate voltage of the on control transistor 83 has a value close to the threshold V83$th$ for the gate voltage. By allowing a large current to be supplied to the gate capacitances 80 and 81 of the output transistor 78, it is possible to set the first clip voltage obtained while the gate capacitances 80 and 81 of the output transistor 78 are discharging currents, at a value almost equal to V1off.

Figure 15:
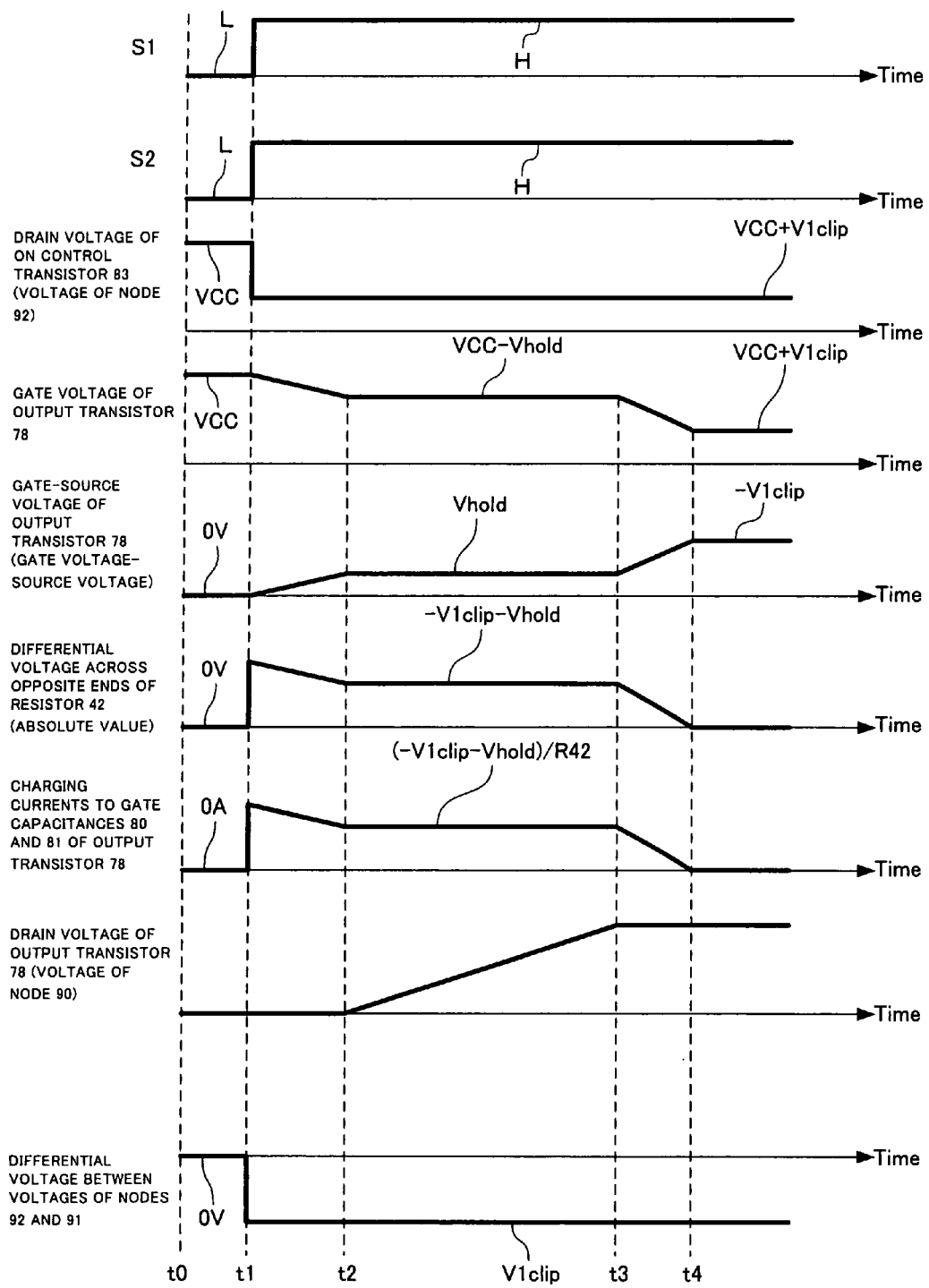
FIG. 15 is a time chart for a switching operation (turn-on) according to Embodiment 7 of the present invention.

Now, with reference to a time chart in FIG. 15, the turn-on switching operation of the output transistor 78 will be described. Since Embodiment 7, shown in FIG. 13, comprises only the clip voltage 1, only the turn-on operation of the output transistor 78 will be described. In the time chart in FIG.

15, it is assumed that in FIG. 13, the driving current is flowing through the inductive load 15 in the a direction and that the output transistor 4 is off. A clip voltage for the first clip circuit 73 is defined as V1clip. As shown above, it is assumed that the value of V1clip is set almost equal to that of V1off.

At the initial t0, the input signals S1 and S2 are at the low level. The gate voltage of the output transistor 78 is thus at the high level, and the output transistor 78 is off. The voltage of the node 90 is at the low level.

At t1, S1 and S2 are switched to the high level to turn on the on control transistor 83, while turning off the off control transistor 82. This drops the voltage of the node 92. However, the above described operation of the first clip circuit clips the differential voltage (the voltage of the node 92—the voltage of the node 91) between the voltages of the nodes 92 and 91 at the fixed voltage V1clip. The voltage of the node 92 is subsequently kept with the clip voltage V1clip maintained with respect to the voltage (VCC) of the node 91. During the period from t1 to t2, the gate capacitances 80 and 81 of the output transistor 78 discharge to increase the gate-source voltage (the source voltage—the gate voltage) of the output transistor 78.

At t2, the gate-source voltage of the output transistor 78 increases to allow the output transistor 78 to supply all the current flowing through the inductive load 15. The voltage of the node 90 then starts rising. The gate-source voltage of the output transistor 78 at this point in time is defined as Vhold. While the voltage of the node 90 is rising, the gate-source voltage of the output transistor 78 is smoothed at the fixed voltage Vhold. Smoothing of the gate-source voltage is a general property of MOS transistors.

At t3, the voltage of the node 90 rises completely up to the high level and then keeps the high level. After t3, the gate-source voltage of the output transistor 78 starts increasing again. At t4, the gate voltage of the output transistor drops down to the voltage of the node 92. Then, the increase in the gate-source voltage of the output transistor 78 stops.

According to the present embodiment, shown in FIG. 13, during the period from t2 to t3, when the voltage of the node 90 rises, the voltage (absolute value) across the opposite ends of the resistor 42 exhibits a fixed value (−V1clip−Vhold). V1clip is a minus voltage. That is, the discharging current from the gate terminal of the output transistor 78 at this point in time is fixed at a value {(−V1clip−Vhold)/R42}. Clearly, the voltage varies linearly when the capacitance is charged with the fixed current. According to the present embodiment, a very linear slew rate can be achieved by inputting the fixed current to the gate capacitance when the voltage of the node 90 is raised by the turn-on operation of the output transistor 78.

Another effect of the first clip circuit 73 is breakdown protection of the forward voltage between the gate and source of the output transistor 78.

While the output transistor 78 is on, the voltage of the gate terminal of the output transistor 78 does not drop to or below the voltage of the node 92 because the voltage of the gate terminal is dropped by the discharge of a current to the node 92. The first clip circuit 73 clips the voltage of the node 92 at the fixed minus voltage with respect to the voltage of the node 91. This is effective for clipping the gate voltage of the output transistor 78 at the fixed minus voltage with respect to the source voltage (the voltage of the node 91) of the output transistor 78.

That is, the first clip voltage of the first clip circuit 73 is set equal to or lower than a breakdown voltage for the gate-source forward voltage of the output transistor 78. This makes it possible to provide gate-source breakdown protection for the output transistor 78.

According to Embodiment 7, even when the high-side output transistors are P-type MOS transistors, the slew rate control and the breakdown protection of the gate-source voltage can be performed as is the case with N-type MOS transistors.

Embodiment 8

Figure 16:
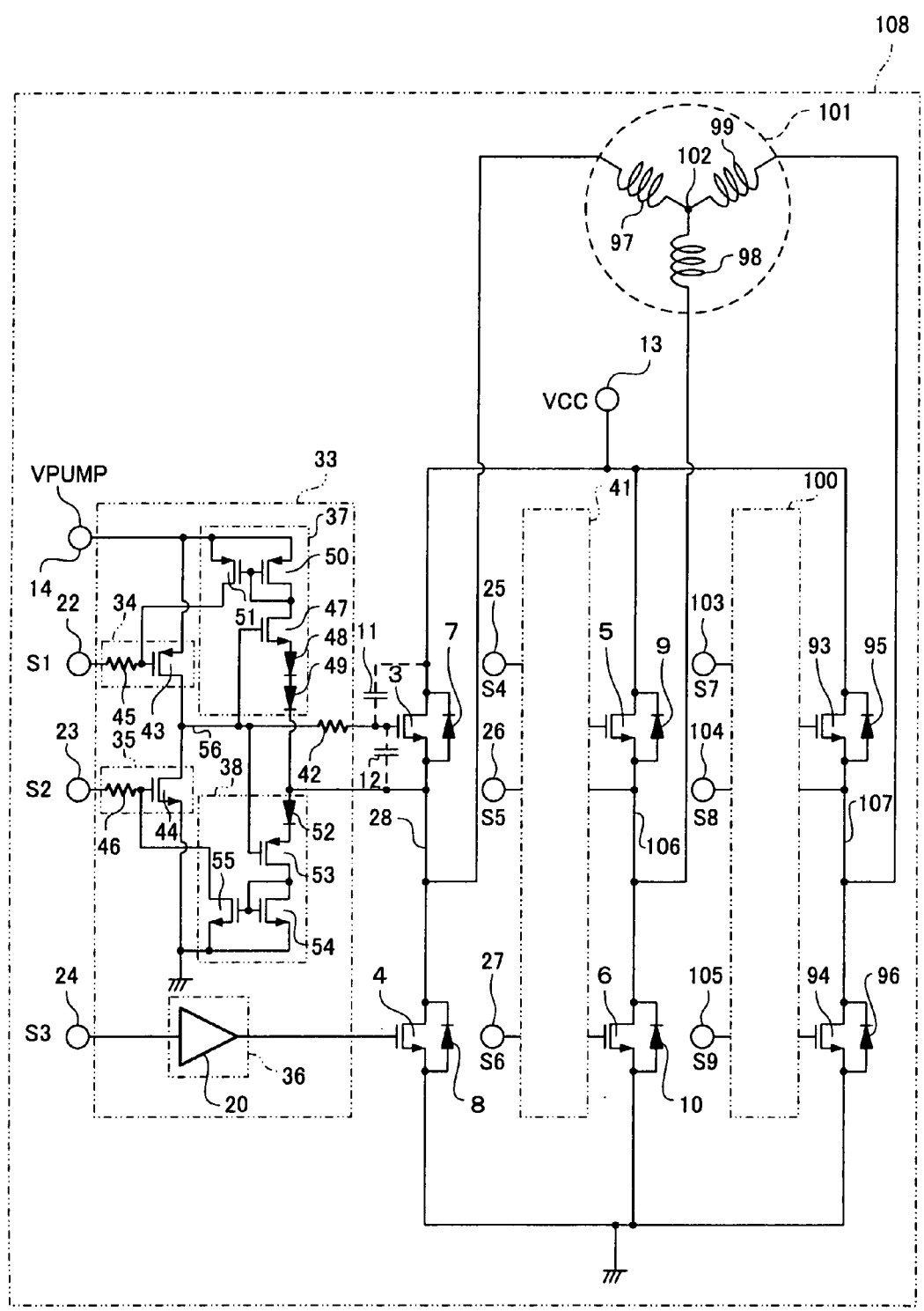
FIG. 16 is a schematic diagram of a motor driving system according to Embodiment 8 of the present invention.

FIG. 16 shows a specific circuit diagram for Embodiment 8 of the present invention. FIG. 16 is a schematic diagram of a motor driving system 108 comprising the switching system according to the present invention.

In FIG. 16, three-phase inductive loads 97, 98, and 99 for a motor 101 each have a first end connected to a neutral point 102 between the inductive loads and a second end connected to a corresponding one of the node 28, which is the connection point between the output transistors 3 and 4, a node 106 that is a connection point between the output transistors 5 and 6, and a node 107 that is a connection point between the output transistors 93 and 94. The output transistors 3, 4, 5, 6, 93, and 94 are N-type MOS transistors. The drain terminals of the output transistors 3, 5 and 93 are connected to the first power supply terminal 13. The source terminals of the output transistors 4 and 6 and a source terminal of the output transistor 94 are connected to the ground. The anode and cathode of the diode 7 are connected to the source and drain, respectively, of the output transistor 3. Similarly, the diodes 8, 9, and 10 and diodes 95 and 96 are connected to the output transistors 4, 5, 6, 93, and 94, respectively. Reference numeral 11 denotes the gate-drain parasitic capacitance in the output transistor 3. Reference numeral 12 denotes the gate-source parasitic capacitance in the output transistor 3. The parasitic capacitances are similarly present in the output transistors 4, 5, 6, 93, and 94 (not shown).

The predrive circuit 33 is provided to drive the gate terminals of the output transistors 3 and 4. The predrive circuit 41 is provided to drive the gate terminals of the output transistors 5 and 6. The predrive circuit 100 is provided to drive the gate terminals of the output transistors 93 and 94. The predrive circuit 33 has the input terminal 22 that drives the on control circuit, the input terminal 23 that drives the off control circuit, and the input terminal 24 that drives the on and off control circuit. The input signals S1, S2, and S3 are input to the input terminals 22, 23, and 24, respectively. The input terminals 25, 26, and 27 of the predrive circuit 41 correspond to the input terminals 22, 23, and 24 of the predrive circuit 33, respectively. The input signals S4, S5, and S6 are applied to the input terminals 25, 26, and 27, respectively. Input terminals 103, 104, and 105 of the predrive circuit 100 correspond to the input terminals 22, 23, and 24 of the predrive circuit 33, respectively. Input signals S7, S8, and S9 are applied to the input terminals 103, 104, and 105, respectively.

The predrive circuits 33, 41, and 100 have the same configuration as that in Embodiment 1, shown in FIG. 2 and will thus not be described below. The switching control system shown in Embodiment 1 in FIG. 2 drives the inductive load of an H bridge configuration. However, the same properties can be obtained even with the motor 101 having the plural-phase inductive load as in the case of the present embodiment.

With this configuration, when the output transistors are to be subjected to PWM driving in order to control the rotation speed of the motor 101, the motor driving system 108 shown in Embodiment 8 can easily set the slew rates of the voltage of the node 28, the voltage of the node 106, and the voltage of the node 107 at appropriate values for the switching operation of the output transistors. Thus, for the motor driving system 108, the possible malfunctioning and destruction of the elements caused by a rapid variation in voltage are prevented. Noise from the motor driving system 108 is reduced to prevent other electric apparatuses from being disturbed. Moreover, operational errors resulting from possible delay are reduced to improve the PWM controllability of the motor. This is effective for reducing heat generation.

Furthermore, since the value of currents needing to flow through the inductive loads 97, 98, and 99 vary depending on, for example, the magnitude of a load on the motor 101 and the rotation speed of the motor 101, output transistors made in accordance with various specifications are selectively used. The present invention can be used for the output transistors made in accordance with the various specifications and can deal with both the slew rate problem and the breakdown voltage problem. In other words, the motor driving system 108 comprising the switching control system according to the present invention can deal with various applications.

Further, the present invention reduces the numbers of elements and terminals required, allowing a reduction in the size and cost of the motor driving system 108.

(Example of Applied Products)

The switching control system according to the present invention is applicable to office apparatuses comprising motors, such as printers, copiers, and shredders. The switching control system according to the present invention is also applicable to electric appliances in general comprising motors, such as washers, air conditioners, refrigerators, and cleaners. The switching control system according to the present invention is also applicable to mobile units comprising motors that are power sources for electric cars, electric motorcycles, motor-assisted bicycles, trains, and airplanes.

The present invention can be used in, for example, a control circuit that controls the passage of a current to a load via a switching circuit driven by PWM control.

What is claimed is:

1. A switching control system comprising:
   a first MOS transistor and a second MOS transistor connected in series between a first power source and a second power source for sequentially passing a current through one of a single-phase inductive load and a plural-phase inductive load;
   an on control circuit for turning on the first MOS transistor;
   a resistor connected between an output terminal of the on control circuit and a gate terminal of the first MOS transistor; and
   a clip circuit for clipping a voltage of the output terminal of the on control circuit with respect to a voltage of a source terminal of the first MOS transistor when a voltage between the gate terminal and source terminal of the first MOS transistor is smoothed,
   wherein for a turn-on operation of the first MOS transistor,
   a current input to the gate terminal of the first MOS transistor is determined by:
      a clip voltage determined by the first clip circuit;
      a voltage between the gate terminal and source terminal of the first MOS transistor; and
      the resistor connected between the output terminal of the on control circuit and the gate terminal of the first MOS transistor.

2. The switching control system according to claim 1, wherein the on control circuit comprises:
   an on control transistor; and
   a resistor connected to a control terminal of the on control transistor, and
   the clip circuit comprises:
   a differential voltage sensing circuit for sensing a differential voltage between a voltage of the source terminal of the first MOS transistor and a voltage of the output terminal of the on control circuit; and
   a feedback circuit for feeding back a signal output by the differential voltage sensing circuit to the control terminal of the on control transistor.

3. The switching control system according to claim 2, wherein the differential voltage sensing circuit comprises:
   a clip voltage setting circuit having an input terminal connected to the source terminal of the first MOS transistor and including one of at least one diode, at least one Zener diode, and at least one resistor; and
   a voltage/current converting circuit for converting a differential voltage between the voltage of the output terminal of the on control circuit and a voltage of the output terminal of the first clip voltage setting circuit into a current and for outputting the current,
   wherein an output current from the voltage/current converting circuit is input to the first feedback circuit as an output signal from the differential voltage sensing circuit.

4. The switching control system according to claim 3, wherein the feedback circuit is a current mirror circuit that inputs a current of a value corresponding to a current value output by the differential voltage sensing circuit, to the control terminal of the on control transistor.

5. A motor driving system comprising:
   a motor having one of a single-phase inductive load and a plural-phase inductive load; and
   at least one switching control system according to claim 1,
   wherein a number of such switching control systems is determined in accordance with a number of phases of the inductive load, and
   one end of the inductive load is connected to a series connection point between the first MOS transistor and the second MOS transistor.

6. A switching control system comprising:
   a first MOS transistor and a second MOS transistor connected in series between a first power source and a second power source for sequentially passing a current through one of a single-phase inductive load and a plural-phase inductive load;
   an off control circuit for turning off the first MOS transistor;
   a resistor connected between an output terminal of the off control circuit and a gate terminal of the first MOS transistor; and
   a clip circuit for clipping a voltage of the output terminal of the off control circuit with respect to a voltage of a source terminal of the first MOS transistor when a voltage between the gate terminal and source terminal of the first MOS transistor is smoothed,
   wherein for a turn-off operation of the first MOS transistor,
   a current input to the gate terminal of the first MOS transistor is determined by:
      a clip voltage determined by the clip circuit;
      a voltage between the gate terminal and source terminal of the first MOS transistor; and
      the resistor connected between the output terminal of the off control circuit and the gate terminal of the first MOS transistor.

7. The switching control system according to claim 6, wherein the off control circuit comprises:

an off control transistor; and a resistor connected to a control terminal of the off control transistor, and the clip circuit comprises:

a differential voltage sensing circuit for sensing a differential voltage between the voltage of the source terminal of the first MOS transistor and the voltage of the output terminal of the off control circuit; and a feedback circuit for feeding back a signal output by the differential voltage sensing circuit to the control terminal of the off control transistor.

8. The switching control system according to claim 7, wherein the differential voltage sensing circuit comprises:

a clip voltage setting circuit having an input terminal connected to the source terminal of the first MOS transistor and including one of at least one diode, at least one Zener diode, and at least one resistor; and a voltage/current converting circuit for converting a differential voltage between the voltage of the output terminal of the off control circuit and a voltage of the output terminal of the clip voltage setting circuit into a current and outputting the current, wherein an output current from the voltage/current converting circuit is input to the feedback circuit as an output signal from the differential voltage sensing circuit.

9. The switching control system according to claim 8, wherein the feedback circuit is a current mirror circuit for inputting a current of a value corresponding to a current value output by the differential voltage sensing circuit, to the control terminal of the off control transistor.

10. A motor driving system comprising:

a motor having one of a single-phase inductive load and a plural-phase inductive load; and at least one switching control system according to claim 6, wherein a number of such switching control systems is determined in accordance with a number of phases of the inductive load, and one end of the inductive load is connected to a series connection point between the first MOS transistor and the second MOS transistor.

\* \* \* \* \*